United States Patent
Shrivastava et al.

(10) Patent No.: US 11,054,711 B2
(45) Date of Patent: Jul. 6, 2021

(54) ELECTROMAGNETIC-SHIELDING ELECTROCHROMIC WINDOWS

(71) Applicant: View, Inc., Milpitas, CA (US)

(72) Inventors: Dhairya Shrivastava, Los Altos, CA (US); Stephen Clark Brown, San Mateo, CA (US); Robert T. Rozbicki, Los Gatos, CA (US); Anshu A. Pradhan, Collierville, TN (US); Sridhar Karthik Kailasam, Fremont, CA (US); Robin Friedman, Sunnyvale, CA (US); Gordon E. Jack, San Jose, CA (US); Dane Thomas Gillaspie, Fremont, CA (US)

(73) Assignee: View, Inc., Milpitas, CA (US)

( * ) Notice: Subject to any disclaimer, the term of this patent is extended or adjusted under 35 U.S.C. 154(b) by 150 days.

(21) Appl. No.: 16/327,789

(22) PCT Filed: Aug. 18, 2017

(86) PCT No.: PCT/US2017/047664
§ 371 (c)(1),
(2) Date: Feb. 22, 2019

(87) PCT Pub. No.: WO2018/039080
PCT Pub. Date: Mar. 1, 2018

(65) Prior Publication Data
US 2019/0219881 A1   Jul. 18, 2019

Related U.S. Application Data

(63) Continuation-in-part of application No. PCT/US2017/031106, filed on May 4, 2017, and a
(Continued)

(51) Int. Cl.
*G02F 1/153* (2006.01)
*H05K 9/00* (2006.01)

(52) U.S. Cl.
CPC ............ *G02F 1/1533* (2013.01); *G02F 1/153* (2013.01); *H05K 9/0005* (2013.01); *G02F 2001/1536* (2013.01); *G02F 2201/501* (2013.01)

(58) Field of Classification Search
CPC ........ G02F 1/155; G02F 1/153; G02F 1/1533; G02F 1/157; G02F 1/163;
(Continued)

(56) References Cited

U.S. PATENT DOCUMENTS

| 4,308,316 A | 12/1981 | Gordon |
| 4,419,386 A | 12/1983 | Gordon |

(Continued)

FOREIGN PATENT DOCUMENTS

| CN | 1267416 A | 9/2000 |
| CN | 1739057 A | 2/2006 |

(Continued)

OTHER PUBLICATIONS

U.S. Appl. No. 62/102,515, filed Jan. 12, 2015, Nagar et al.
(Continued)

*Primary Examiner* — Mohammed A Hasan
(74) *Attorney, Agent, or Firm* — Weaver Austin Villeneuve & Sampson LLP; Brian D. Griedel

(57) ABSTRACT

Electromagnetic-shielding, electrochromic windows comprising a first multi-layer conductor, an electrochromic stack disposed on the first multi-layer conductor, and a second multi-layer conductor, wherein the one or more multi-layer conductors with an electromagnetic shielding stack configured to be activated to block electromagnetic communication signals through the windows.

16 Claims, 10 Drawing Sheets

Related U.S. Application Data continuation-in-part of application No. PCT/US2015/062387, filed on Nov. 24, 2015, and a continuation-in-part of application No. PCT/US2016/023293, filed on Mar. 18, 2016, said application No. PCT/US2017/031106 is a continuation-in-part of application No. PCT/US2015/062387, filed on Nov. 24, 2015.

(60) Provisional application No. 62/378,136, filed on Aug. 22, 2016, provisional application No. 62/379,163, filed on Aug. 24, 2016, provisional application No. 62/333,103, filed on May 6, 2016, provisional application No. 62/340,936, filed on May 24, 2016, provisional application No. 62/352,508, filed on Jun. 20, 2016, provisional application No. 62/084,502, filed on Nov. 25, 2014, provisional application No. 62/136,354, filed on Mar. 20, 2015.

(58) Field of Classification Search
CPC ...... G02F 2001/1536; G02F 2201/501; H05K 9/0005; H05K 9/0088; H02J 50/00
USPC .......................................................... 359/265
See application file for complete search history.

(56) References Cited

U.S. PATENT DOCUMENTS

| | | |
|---|---|---|
| 4,864,314 A | 9/1989 | Bond |
| 4,874,903 A | 10/1989 | Clarke et al. |
| 4,932,755 A | 6/1990 | Holdridge et al. |
| 5,124,833 A | 6/1992 | Barton |
| 5,139,850 A | 8/1992 | Clarke et al. |
| 5,147,694 A | 9/1992 | Clarke |
| 5,352,504 A | 10/1994 | Boulanger et al. |
| 5,699,192 A | 12/1997 | Van Dine et al. |
| 5,724,187 A | 3/1998 | Varaprasad et al. |
| 5,959,586 A | 9/1999 | Benham et al. |
| 6,094,292 A | 7/2000 | Goldner et al. |
| 6,104,513 A | 8/2000 | Bloom |
| 6,128,471 A | 10/2000 | Quelch et al. |
| 6,456,239 B1 | 9/2002 | Werb et al. |
| 6,703,981 B2 | 3/2004 | Meitzler et al. |
| 6,770,176 B2 | 8/2004 | Benson et al. |
| 6,795,226 B2 | 9/2004 | Agrawal et al. |
| 6,809,692 B2 | 10/2004 | Baliarda et al. |
| 7,265,890 B1 | 9/2007 | Demiryont |
| 7,593,154 B2 | 9/2009 | Burdis et al. |
| 7,722,948 B2 | 5/2010 | Dixon et al. |
| 8,213,074 B1 | 7/2012 | Shrivastava et al. |
| 8,259,380 B1 | 9/2012 | Valentin et al. |
| 8,614,848 B2 | 12/2013 | Ueda et al. |
| 8,634,764 B2 | 1/2014 | Cruz et al. |
| 8,780,432 B1* | 7/2014 | Nguyen ............... G02F 1/1347 359/275 |
| 8,924,076 B2 | 12/2014 | Boote et al. |
| 8,927,069 B1 | 1/2015 | Estinto et al. |
| 8,975,789 B2 | 3/2015 | Snyker et al. |
| 9,007,674 B2 | 4/2015 | Kailasam et al. |
| 9,229,291 B2 | 1/2016 | Kailasam et al. |
| 9,356,316 B2 | 5/2016 | Sun et al. |
| 9,408,303 B2 | 8/2016 | Hassan et al. |
| 9,454,055 B2 | 9/2016 | Brown et al. |
| 9,664,976 B2 | 5/2017 | Rozbicki |
| 9,898,912 B1 | 2/2018 | Jordan, II et al. |
| 9,921,421 B2 | 3/2018 | Branda et al. |
| 10,153,845 B2 | 12/2018 | Ashrafi |
| 10,254,618 B2 | 4/2019 | Parker |
| 10,288,969 B2 | 5/2019 | Kailasam et al. |
| 10,299,101 B1 | 5/2019 | Lim et al. |
| 10,303,032 B2 | 5/2019 | Brossard et al. |
| 10,673,121 B2 | 6/2020 | Hughes et al. |
| 10,788,723 B2 | 9/2020 | Rozbicki et al. |
| 10,797,373 B2 | 10/2020 | Hughes et al. |
| 10,969,645 B2 | 4/2021 | Rozbicki et al. |
| 2002/0140611 A1 | 10/2002 | Ligander et al. |
| 2002/0149829 A1 | 10/2002 | Mochizuka et al. |
| 2003/0034926 A1 | 2/2003 | Veerasamy |
| 2003/0098791 A1 | 5/2003 | Carlson et al. |
| 2003/0117066 A1 | 6/2003 | Silvernail |
| 2003/0227663 A1 | 12/2003 | Agrawal et al. |
| 2003/0232181 A1 | 12/2003 | Simpson et al. |
| 2004/0121571 A1 | 6/2004 | Uchikoshi et al. |
| 2004/0123804 A1 | 7/2004 | Yamazaki et al. |
| 2004/0160324 A1 | 8/2004 | Stilp |
| 2004/0160657 A1 | 8/2004 | Tonar et al. |
| 2005/0003737 A1 | 1/2005 | Montierth et al. |
| 2005/0082639 A1 | 4/2005 | Kikuta et al. |
| 2005/0157675 A1 | 7/2005 | Feder et al. |
| 2005/0195488 A1 | 9/2005 | McCabe et al. |
| 2005/0254442 A1 | 11/2005 | Proctor et al. |
| 2005/0260983 A1 | 11/2005 | DiPiazza |
| 2006/0033663 A1 | 2/2006 | Saint Clair et al. |
| 2006/0033978 A1 | 2/2006 | Morin et al. |
| 2006/0132885 A1 | 6/2006 | Pichot et al. |
| 2007/0042819 A1 | 2/2007 | Li et al. |
| 2007/0097481 A1 | 5/2007 | Burdis et al. |
| 2007/0126637 A1 | 6/2007 | Habib et al. |
| 2007/0292606 A1 | 12/2007 | Demiryont |
| 2008/0018979 A1 | 1/2008 | Mahe et al. |
| 2008/0143906 A1 | 6/2008 | Allemand et al. |
| 2008/0177919 A1 | 7/2008 | Miyazawa et al. |
| 2009/0047900 A1 | 2/2009 | Cruz et al. |
| 2009/0054054 A1 | 2/2009 | Shao et al. |
| 2009/0067031 A1 | 3/2009 | Piroux et al. |
| 2009/0139052 A1 | 6/2009 | Boenisch |
| 2009/0202743 A1 | 8/2009 | Schaepkens et al. |
| 2009/0224980 A1 | 9/2009 | Cruz et al. |
| 2009/0296190 A1 | 12/2009 | Anderson et al. |
| 2010/0052718 A1 | 3/2010 | Baker et al. |
| 2010/0053722 A1 | 3/2010 | Finley et al. |
| 2010/0060971 A1 | 3/2010 | Schwendeman et al. |
| 2010/0079844 A1 | 4/2010 | Kurman et al. |
| 2010/0165436 A1 | 7/2010 | Voss et al. |
| 2010/0165440 A1 | 7/2010 | Nguyen et al. |
| 2010/0171667 A1 | 7/2010 | Knudsen |
| 2010/0243427 A1 | 9/2010 | Kozlowski et al. |
| 2010/0245973 A1 | 9/2010 | Wang et al. |
| 2011/0031821 A1 | 2/2011 | Greene et al. |
| 2011/0074342 A1 | 3/2011 | MacLaughlin |
| 2011/0080630 A1* | 4/2011 | Valentin ............... G02F 1/1508 359/265 |
| 2011/0148218 A1 | 6/2011 | Rozbicki |
| 2011/0159821 A1 | 6/2011 | Park |
| 2011/0248901 A1 | 10/2011 | Alexopoulos et al. |
| 2011/0260856 A1 | 10/2011 | Rossmann et al. |
| 2011/0266138 A1 | 11/2011 | Wang et al. |
| 2011/0267673 A1 | 11/2011 | Agrawal et al. |
| 2011/0267674 A1 | 11/2011 | Wang et al. |
| 2012/0033287 A1 | 2/2012 | Friedman et al. |
| 2012/0038967 A1 | 2/2012 | Copeland et al. |
| 2012/0133213 A1 | 5/2012 | Borke et al. |
| 2012/0154241 A1 | 6/2012 | Tatarnikov et al. |
| 2012/0188627 A1 | 7/2012 | Chen et al. |
| 2012/0194895 A1 | 8/2012 | Podbelski et al. |
| 2012/0217346 A1 | 8/2012 | Eberle et al. |
| 2012/0275008 A1* | 11/2012 | Pradhan ............... C23C 14/14 359/265 |
| 2012/0287017 A1 | 11/2012 | Parsche |
| 2013/0107563 A1 | 5/2013 | McCabe et al. |
| 2013/0243120 A1 | 9/2013 | Tsai et al. |
| 2013/0271814 A1 | 10/2013 | Brown et al. |
| 2013/0337603 A1 | 12/2013 | Steinhauser et al. |
| 2014/0022621 A1 | 1/2014 | Kailasam et al. |
| 2015/0131140 A1 | 5/2015 | Kailasam et al. |
| 2015/0155737 A1 | 6/2015 | Mayo |
| 2015/0222126 A1 | 8/2015 | Leabman et al. |
| 2015/0253642 A1 | 9/2015 | Kalweit et al. |
| 2015/0323287 A1 | 11/2015 | Durand |
| 2016/0020647 A1 | 1/2016 | Leabman et al. |
| 2016/0028162 A1 | 1/2016 | Ou et al. |
| 2016/0124283 A1 | 5/2016 | Brown et al. |
| 2016/0141258 A1 | 5/2016 | Jain et al. |
| 2016/0149635 A1 | 5/2016 | Hinman et al. |

(56) References Cited

U.S. PATENT DOCUMENTS

| | | |
|---|---|---|
| 2016/0154290 A1 | 6/2016 | Brown et al. |
| 2016/0181873 A1 | 6/2016 | Mitcheson et al. |
| 2016/0183056 A1 | 6/2016 | Leabman |
| 2016/0209723 A1 | 7/2016 | Rozbicki |
| 2016/0248270 A1 | 8/2016 | Zeine et al. |
| 2017/0052753 A1 | 2/2017 | Paolini, Jr. |
| 2017/0117754 A1 | 4/2017 | Noori et al. |
| 2017/0219906 A1 | 8/2017 | Garcia et al. |
| 2017/0272145 A1 | 9/2017 | Lilja |
| 2017/0279155 A1 | 9/2017 | Sun et al. |
| 2017/0365908 A1 | 12/2017 | Hughes |
| 2018/0090992 A1 | 3/2018 | Shrivastava et al. |
| 2018/0095337 A1 | 4/2018 | Rozibicki et al. |
| 2018/0138576 A1 | 5/2018 | Cohen |
| 2018/0301783 A1 | 10/2018 | Bulja et al. |
| 2019/0036209 A1 | 1/2019 | Au |
| 2019/0044606 A1 | 2/2019 | Mansikkamaki |
| 2019/0067826 A1 | 2/2019 | Achour et al. |
| 2019/0107764 A1 | 4/2019 | Kailasam et al. |
| 2019/0155120 A1 | 5/2019 | Li et al. |
| 2019/0267840 A1 | 8/2019 | Rozbicki et al. |
| 2019/0319335 A1 | 10/2019 | Hughes et al. |
| 2019/0324341 A1* | 10/2019 | Tonar .............. B32B 15/082 |
| 2019/0331977 A1 | 10/2019 | Rozbicki et al. |
| 2020/0201132 A1 | 6/2020 | Kailasam et al. |
| 2020/0233278 A1 | 7/2020 | Kailasam |
| 2020/0259237 A1 | 8/2020 | Shrivastava et al. |
| 2020/0321682 A1 | 10/2020 | Hughes et al. |
| 2020/0379310 A1 | 12/2020 | Rozbicki et al. |
| 2021/0001426 A1 | 1/2021 | Dixit et al. |
| 2021/0018810 A1 | 1/2021 | Rozbicki et al. |
| 2021/0040789 A1 | 2/2021 | Rozbicki et al. |
| 2021/0119318 A1 | 4/2021 | Hughes et al. |

FOREIGN PATENT DOCUMENTS

| | | |
|---|---|---|
| CN | 101032052 A | 9/2007 |
| CN | 101401312 A | 4/2009 |
| CN | 101868346 A | 10/2010 |
| CN | 102255119 A | 11/2011 |
| CN | 102388340 A | 3/2012 |
| CN | 104102060 A | 10/2014 |
| CN | 104321497 A | 1/2015 |
| CN | 104884248 A | 9/2015 |
| CN | 104730795 B | 5/2018 |
| EP | 0413580 A1 | 2/1991 |
| EP | 0588514 A1 | 3/1994 |
| EP | 1297380 B1 | 11/2008 |
| EP | 2851993 A1 | 3/2015 |
| EP | 3617788 A1 | 3/2020 |
| JP | S58-163921 A | 9/1983 |
| JP | S63-271320 A | 11/1988 |
| JP | H07-028099 | 1/1995 |
| JP | 2007-108750 A | 4/2007 |
| JP | 2012-058515 A | 3/2012 |
| JP | 2012-523018 A | 9/2012 |
| JP | 2012-194412 | 10/2012 |
| JP | 2013-062133 A | 4/2013 |
| JP | 2013-515457 A | 5/2013 |
| JP | 2013-149433 A | 8/2013 |
| KR | 10-2010-024174 A | 3/2010 |
| KR | 10-2012-0007471 A | 1/2012 |
| TW | 282613 | 8/1996 |
| TW | 201344874 A | 11/2013 |
| TW | 201423773 A | 6/2014 |
| TW | M519749 U | 4/2016 |
| WO | WO94/15247 A1 | 7/1994 |
| WO | WO01/82410 A1 | 11/2001 |
| WO | WO2004/026633 A2 | 4/2004 |
| WO | WO2006/014591 | 2/2006 |
| WO | WO2008/073372 A2 | 6/2008 |
| WO | WO2008/150851 A1 | 12/2008 |
| WO | WO2010/014648 A1 | 2/2010 |
| WO | WO2011/082208 A2 | 7/2011 |
| WO | WO2011/112882 A1 | 9/2011 |
| WO | WO2012/174260 | 12/2012 |
| WO | WO2013/121103 A1 | 8/2013 |
| WO | WO2013/155467 A1 | 10/2013 |
| WO | WO2013/158365 A1 | 10/2013 |
| WO | WO2013/158464 A1 | 10/2013 |
| WO | WO2014/099974 A1 | 6/2014 |
| WO | WO2014/152493 A1 | 9/2014 |
| WO | WO2015/013578 A1 | 1/2015 |
| WO | WO2015/075007 | 5/2015 |
| WO | WO2015/077829 A1 | 6/2015 |
| WO | WO2016/029044 A1 | 2/2016 |
| WO | WO2016/072620 A1 | 5/2016 |
| WO | WO2016/085964 | 6/2016 |
| WO | WO2016/126460 A2 | 8/2016 |
| WO | WO2016/154064 A1 | 9/2016 |
| WO | WO2016/174228 A1 | 11/2016 |
| WO | WO2017/062915 A1 | 4/2017 |
| WO | WO2017/129855 | 8/2017 |
| WO | WO2017/192881 | 11/2017 |
| WO | WO2017/192881 A1 | 11/2017 |
| WO | WO2018/039080 A1 | 3/2018 |
| WO | WO2018/063919 | 4/2018 |
| WO | WO2018/094203 A1 | 5/2018 |
| WO | WO2019/022129 A1 | 9/2019 |
| WO | WO2019/178540 A1 | 9/2019 |
| WO | WO2020/227702 A2 | 11/2020 |
| WO | WO2020/243690 A1 | 12/2020 |

OTHER PUBLICATIONS

U.S. Appl. No. 62/102,516, filed Jan. 12, 2015, Nagel et al.
International Search Report and Written Opinion (ISA/KR) dated Mar. 8, 2016 in PCT Application No. PCT/US2015/062387.
International Preliminary Report on Patentability dated Jun. 8, 2017 in PCT Application No. PCT/US2015/062387.
International Search Report and Written Opinion (ISA/KR) dated Aug. 22, 2017 in PCT Application No. PCT/US2017/031106.
International Preliminary Report on Patentability dated Nov. 15, 2018 in PCT Application No. PCT/US2017/031106.
International Search Report and Written Opinion (ISA/KR) dated Feb. 6, 2018 in PCT/US2017/052798.
International Search Report and Written Opinion (ISA/KR) dated Dec. 13, 2017 in PCT/US2017/047664.
EP Partial Supplementary Search Report dated May 23, 2018 in EP Application No. 15863433.7.
EP Extended Search Report dated Sep. 6, 2018 in EP Application No. 15863433.7.
Saberin, J. R., "Optically Transparent Antennas for Small Satellites," University of Utah, Dept. of Electrical and Computer Engineering, Masters Thesis, Aug. 2010, 55 pp.
Pasternack Enterprises, Inc. Technical Data Sheet for MCX Jack Connector Solder Attachment Surface Mount PCB (PE4889), 2013, 2 pp.
Rolith Inc., "NanoWeb: sub-micron transparent metal mesh conductors," [http://www.rolith.com/applications/transparent-conductive-electrodes] retrieved Jan. 29, 2016, 3 pp.
Yasin, T. et al., "A Study on the Efficiency of Transparent Patch Antennas Designed from Conductive Oxide Films," IEEE International Symposium on Antennas and Propagation (APSURSI), Spokane, WA, Jul. 3-8, 2011, pp. 3085-.087.
Azini, A.S. et al., "Transparent Antenna Design for Wireless Access Point Application," PIERS Proceedings, Taipei, Mar. 25-28, 2013, pp. 910-913.
Yasin, T., "Transparent Antennas for Solar Cell Integration," Utah State University, Dept. of Electrical Engineering, Doctoral Thesis, 2013, 98 pp.
WeBoost Connect 3G Cell Phone Booster 472205 [https://store.weboost.com/products/connect-3g-directional] retrieved Apr. 1, 2016, 12 pp.
SunPartner Technologies web page, "Smart Building-Design Glass", [http://sunpartnertechnologies.com/vitrage-intelligent/]; 3 pages; retrieved Jan. 24, 2018.
SunPartner Technologies web page, "Smart Building-Cameleon", [http://sunpartnertechnologies.com/vitrage-intelligent/]; 3 pages; retrieved Jan. 24, 2018.

(56) References Cited

OTHER PUBLICATIONS

SunPartner Technologies web page, "Smart Building-Vision Glass", [http://sunpartnertechnologies.com/vitrage-intelligent/]; 3 pages; retrieved Jan. 24, 2018.
SunPartner Technologies web page, "Li-Fi", [http://sunpartnertechnologies.com/li-fi]; 3 pages; retrieved Jan. 24, 2018.
SunPartner Technologies White Paper, "Wysips Connect, the first solution for the indoor/outdoor VLC lighting saturation problematics," Feb. 26, 2015, 6 pages, [http://sunpartnertechnologies.com/wp-content/uploads/2012/08/White_Paper_LiFi_26_02_2015.pdf].
"That's right, 5G could depend on Corning glass in your antenna," by Robert Triggs, Android Authority, Mar. 2, 2018, 5 pp.. [https://www.androidauthority.com/corning-glass-5g-antenna-842341/] downloaded Nov. 13, 2018.
U.S. Office Action for U.S. Appl. No. 13/763,505 dated May 23, 2014.
U.S. Notice of Allowance for U.S. Appl. No. 13/763,505 dated Oct. 23, 2014.
U.S. Notice of Allowance for U.S. Appl. No. 14/601,141 dated Sep. 25, 2015.
U.S. Office Action for U.S. Appl. No. 15/086,438 dated Jul. 27, 2017.
U.S. Final Office Action for U.S. Appl. No. 15/086,438 dated Feb. 9, 2018.
U.S. Notice of Allowance for U.S. Appl. No. 15/086,438 dated Dec. 28, 2018.
International Preliminary Report on Patentability dated Aug. 20, 2015, issued in PCT/US2014/015374.
International Search Report and Written Opinion dated Nov. 27, 2014, issued in PCT/US2014/015374.
Australian Examination Report dated Feb. 16, 2017 in AU Application No. 2014214738.
Australian Office Action dated Jun. 30, 2017 issued in AU Application No. 2014214738.
Australian Examination Report dated Jul. 10, 2018 in AU Application No. 2017204525.
Chinese Office Aciton dated May 19, 2017 issued in CN Application No. 201480010617.X.
Chinese Office Aciton dated Feb. 2, 2018 issued in CN Application No. 201480010617.X.
Extended European Search Report dated Aug. 12, 2016, issued in EP Application No. 14749144.3.
European Office Action dated Jan. 22, 2019 in EP Application No. 14749144.3.
Russian Decision to Grant, including Search Report, dated Jan. 9, 2018 issued in RU Application No. 2015138108.
Taiwan Office Action dated Jul. 6, 2017 issued in TW Application No. 103104169.
International Preliminary Report on Patentability dated Oct. 5, 2017 issued in PCT/US16/23293.
International Search Report and Written Opinion dated Jul. 29, 2016 issued in PCT/US16/23293.
Extended European Search Report dated Oct. 19, 2018 in EP Application No. 16769458.7.
International Search Report and Written Opinion dated Dec. 13, 2017 in PCT/US2017/047664.
Abdullah, et al., the properties of ITO/arc-ZnO passivating layer for TCO conducting substrate deposited by RF magnetron sputtering, Advanced Materials Research, vol. 832, 2014, pp. 579-584.
Al Shakhs, M. et al., "Boosting the transparency of thin layers by coatings of opposing susceptibility: how metals help see through dielectrics," Scientific Reports (www.nature.com); 6:20659; DOI: 10.1038/srep20659, Feb. 10, 2016, 9 pp.
Crupi, I., et al., "Optimization of ZnO:Al/Ag/ZnO:Al structures for ultra-thin high-performance transparent conductive electrodes," vol. 520, No. 13, Apr. 30, 2012, pp. 4432-4435.
Filatova, E. O. et al., "Transparent-conductive-oxide (TCO) buffer layer effect on the resistive switching process in metal/TiO2/TCO/metal assemblies," New Journal of Physics 16 (2014) 113014.
Guillen, C. et al., "TCO/metal/TCO structures for energy and flexible electronics," Thin Solid Films 520, 2011, pp. 1-17.
Jager, T. et al., "Thin films of SnO2:F by reactive magnetron sputtering with rapid thermal post-annealing," vol. 553, Feb. 28, 2014, pp. 21-25.
Rubin, M., "Optical properties of soda lime silica glasses," Solar Energy Materials, vol. 12, No. 4, 1985, pp. 275-288.
Tvarusko, Aladar, "The electric resistivity of AgO," J. Electrochem. Soc. 1968 115(11), pp. 1105-1110.
Von Rottkay, K. et al, "Optical indices of pyrolytic tin-oxide glass," Mater. Res. Soc. Symp. Proc., vol. 426, 1996, 449, (LBNL Publication 38586), 7 pp.
Macleod, H.A., "Thin-film optical filters, 3rd Edition, (Chapter 15: Characteristics of thin-film dielectric materials)," 1986, Bristol, UK, pp. 622-627.
U.S. Appl. No. 15/529,677, filed May 25, 2017, Hughes, et al.
U.S. Appl. No. 16/509,189, filed Jul. 11, 2019, Rozbicki et al.
Preliminary Amendment dated Jun. 8, 2017 in U.S. Appl. No. 15/529,677.
US Office Action dated Nov. 12, 2020 in U.S. Appl. No. 16/334,716.
US Office Action dated Jul. 25, 2019 in U.S. Appl. No. 15/529,677.
US Office Action dated Jan. 16, 2020 in U.S. Appl. No. 15/529,677.
US Office Action dated Sep. 23, 2019 in U.S. Appl. No. 16/451,784.
US Final Office Action dated Feb. 6, 2020 in U.S. Appl. No. 16/451,784.
US Notice of Allowance dated May 26, 2020 in U.S. Appl. No. 16/451,784.
US Office Action dated Jan. 21, 2021 in U.S. Appl. No. 15/709,339.
International Preliminary Report on Patentability dated Apr. 11, 2019 in PCT/US2017/052798.
International Search Report and Written Opinion (ISA/EP) dated May 9, 2019 in PCT/US2019/022129.
International Preliminary Report on Patentability dated Sep. 24, 2020 in PCT/US2019/022129.
EP Extended Search Report dated Mar. 31, 2020 in EP Application No. 17857230.1.
Australian Office Action dated May 10, 2019 in AU Application No. 2015353606.
Australian Office Action dated Aug. 20, 2019 in AU Application No. 2015353606.
Australian Office Action dated Mar. 4, 2020 in AU Application No. 2015353606.
Australian Office Action dated Apr. 8, 2020 in AU Application No. 2015353606.
CN Office Action dated Mar. 5, 2019 in CN Application No. 201580070207.9.
CN Office Action dated Aug. 6, 2019 in CN Application No. 201580070207.9.
CN Office Action dated Oct. 22, 2020 in CN Application No. 201911227990.1.
European Office Action dated Oct. 17, 2019 in EP Application No. 15863433.7.
European Office Action dated Jul. 8, 2020 in EP Application No. 15863433.7.
Indian Office Action dated Sep. 25, 2020 in in Application No. 201737018864.
Taiwanese Office Action dated Oct. 1, 2019 in TW Application No. 104139297.
Taiwanese Office Action dated Mar. 16, 2020 in TW Application No. 104139297.
EP Extended Search Report dated Dec. 4, 2019 in EP Application No. 17793364.5.
CN Office Action dated Apr. 29, 2020 in CN Application No. 201780038353.2.
CN Office Action dated Nov. 6, 2020 in CN Application No. 201780038353.2.
International Preliminary Report on Patentability dated Mar. 7, 2019 in PCT/US2017/047664.
EP Extended Search Report dated Feb. 25, 2020 in EP Application No. 17844188.7.
International Search Report and Written Opinion (ISA/EP) dated Dec. 7, 2020 in PCT Application No. PCT/US2020/032269.

(56) References Cited

OTHER PUBLICATIONS

International Search Report and Written Opinion (ISA/EP) dated Sep. 30, 2020 in PCT Application No. PCT/US2020/035485.
AGC, Inc., "AGC completes development of 5G-compatible 'Glass Antenna that adds cellular base station capabilities to windows,'" Press Release, Jun. 3, 2020, 2 pages.
Saad, A. "Printed millimeter-wave MIMO-based slot antenna arrays for 5G networks," AEU—International Journal of Electronics and Communications, vol. 99, Feb. 2019, pp. 59-69.
U.S. Office Action for U.S. Appl. No. 16/209,514 dated Mar. 18, 2020.
U.S. Final Office Action for U.S. Appl. No.. 16/209,514 dated Nov. 25, 2020.
U.S. Office Action for U.S. Appl. No. 16/509,189 dated Mar. 13, 2020.
U.S. Notice of Allowance for U.S. Appl. No. 16/509,189 dated Jul. 8, 2020.
U.S. Office Action for U.S. Appl. No. 15/560,146 dated Aug. 7, 2019.
U.S.Final Office Action for U.S. Appl. No. 15/560,146 dated Apr. 14, 2020.
U.S. Notice of Allowance for U.S. Appl. No. 15/560,146 dated Aug. 28, 2020.
U.S. Notice of Allowance for U.S. Appl. No. 15/560,146 dated Jan. 15, 2021.
Canadian Office Action dated Feb. 24, 2020 issued in CA Application No. 2,899,607.
Canadian Office Action dated Nov. 12, 2020 issued in CA Application No. 2,899,607.
European Office Action dated Feb. 28, 2020 in EP Application No. 19183372.2.
European Office Action dated Aug. 20, 2020 in EP Application No. 19183372.2.
European Search Report dated Aug. 21, 2019 in EP Application No. 19183372.2.
European Office Action dated Sep. 5, 2019 in EP Application No. 19183372.2.
Indian Office Action dated Oct. 30, 2019 in in Application No. 2583/KOLNP/2015.
Korean Office Action dated Mar. 5, 2020 in KR Application No. 10-2015-7022800.
Korean Notice of Refusal dated Dec. 1, 2020 in KR Application No. 10-2015-7022800.
Chinese Office Action dated Apr. 9, 2020 in CN Application No. 201680023096.0.
International Search Report and Written Opinion dated May 24, 2019 in PCT/US19/22580.
International Preliminary Report on Patentability dated Oct. 6. 2020 in PCT/US19/22580.
U.S. Appl. No. 63/080,899, filed Sep. 21, 2020, Makker et atl.
U.S. Appl. No. 16/980,305, filed Sep. 11, 2020, Rozbicki et al.
U.S. Appl. No. 16/949,978, filed Nov. 23, 2020, Hughes, et al.
Taiwan Office Action dated Jan. 25, 2021 issued in TW Application No. 106128249.
Taiwan Office Action dated Dec. 31, 2020 issued in TW Application No. 106133563.
Australian Office Action dated Feb. 19, 2021 in AU Application No. 2017260101.
JP Office Action dated Mar. 2, 2021 in JP Application No. 2018-557808.
Chinese Office Aciton dated Dec. 23, 2020 issued in CN Application No. 201811008514.6.
Preliminary Amendment dated Mar. 5, 2021 in U.S. Appl. No. 17/192,883.
U.S. Appl. No. 63/146,365, filed Feb. 5, 2021, Brown et al.
U.S. Appl. No. 17/192,883, filed Mar. 4, 2021, Rozbicki et al.
US Notice of Allowance dated Apr. 19, 2021 in U.S. Appl. No. Apr. 19, 2021.
Indian Office Action dated Mar. 24, 2021 in in Application No. 201817042545.
CN Office Action dated Apr. 6, 2021 in CN Application No. 201911227990.1.
CN Office Action dated Apr. 6, 2021 in CN Application No. 201780038353.2.
Korean Office Action dated Mar. 24, 2021 in KR Application No. 10-2020-7038114.
PCT Application No. PCT/US2021/017946 filed Feb. 12, 2021.
U.S. Appl. No. 63/171,871, filed Apr. 7, 2021, Gomez-Martinez et al.

\* cited by examiner

US 11,054,711 B2

ELECTROMAGNETIC-SHIELDING ELECTROCHROMIC WINDOWS

CROSS-REFERENCES TO RELATED APPLICATIONS

This application is a national stage application under 35 U.S.C. § 371 to international PCT application PCT/US2017/047664 (designating the United States), which claims benefit of and priority to U.S. Provisional Patent Application No. 62/378,136, titled "FASTER SWITCHING LOW-DEFECT ELECTROCHROMIC WINDOWS" and filed on Aug. 22, 2016, and to U.S. Provisional Patent Application No. 62/379,163, titled "WINDOW ANTENNAS" and filed on Aug. 24, 2016; international PCT application PCT/US2017/047664 is a continuation-in-part of PCT Application No. PCT/US2017/031106 (designating the United States), titled "WINDOW ANTENNAS" and filed on May 4, 2017; international PCT application PCT/US2017/047664 is also a continuation-in-part of international PCT application PCT/US2016/023293, titled "FASTER SWITCHING LOW-DEFECT ELECTROCHROMIC WINDOWS" and filed on Mar. 18, 2016, which claims priority to and benefit of U.S. Provisional Application No. 62/136,354, titled "FASTER SWITCHING LOW-DEFECT ELECTROCHROMIC WINDOWS" and filed on Mar. 20, 2015; international PCT Application No. PCT/US2017/031106 is a continuation-in-part of international PCT application PCT/US2015/062387(designating the United States), titled "WINDOW ANTENNAS" and filed on Nov. 24, 2015, which claims priority to and benefit of U.S. Provisional Patent Application No. 62/084,502, titled "WINDOW ANTENNA" and filed on Nov. 25, 2014; international PCT application PCT/US2017/047664 is also a continuation-in-part of international PCT application PCT/US2015/062387 (designating the United States), titled "WINDOW ANTENNAS"and filed on Nov. 24, 2015; international PCT application PCT/US2017/047664 is also a continuation-in-part of international PCT application PCT/US2017/031106 (designating the United States), titled "WINDOW ANTENNAS" and filed on May 4, 2017, which claims benefit of and priority to U.S. Provisional Patent Application No. 62/333,103, titled "WINDOW ANTENNAS" and filed on May 6, 2016, U.S. Provisional Patent Application No. 62/340,936, titled "WINDOW ANTENNAS" and filed on May 24, 2016, U.S. Provisional Patent Application No. 62/352,508, titled "WINDOW ANTENNAS" and filed on Jun. 20, 2016, and U.S. Provisional Patent Application No. 62/379,163, titled "WINDOW ANTENNAS" and filed on Aug. 24, 2016; each of these applications is hereby incorporated by reference in its entirety and for all purposes.

FIELD

The disclosure generally relates to electrochromic devices and in particular to material layers in electrochromic devices.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance. Electrochromic materials may be incorporated into, for example, windows and mirrors. The color, transmittance, absorbance, and/or reflectance of such windows and mirrors may be changed by inducing a change in the electrochromic material. However, advances in electrochromic technology, apparatus, and related methods of making and/or using them, are needed because conventional electrochromic windows suffer from, for example, high defectivity and low versatility.

SUMMARY

Certain embodiments pertain to electrochromic devices comprising first and second conductors, wherein at least one of the first and second conductors is a multi-layered conductor. The electrochromic devices further comprising an electrochromic stack between the conductors adjacent a substrate. The at least one multi-layer conductor comprises a metal layer sandwiched between a first non-metal layer and a second non-metal layer such that the metal layer does not contact the electrochromic stack.

Certain embodiments pertain to an electrochromic device comprising first and second conductors and an electrochromic stack between the first and second conductors adjacent a substrate. At least one of the first and second conductors is a multi-layered conductor. The multi-layer conductor comprises a metal layer sandwiched between a first non-metal layer and a second non-metal layer such that the metal layer does not contact the electrochromic stack. In one embodiment, each of the first and second non-metal layers is a transparent conductive oxide layer or a second defect mitigating insulating layer. In one embodiment, the electrochromic device further comprises one or more additional metal layers, wherein each of the additional metal layers is sandwiched between the first non-metal layer and the second non-metal layer and optionally each of the first and second non-metal layers is a transparent conductive oxide layer or a second defect mitigating insulating layer or the first and second non-metal layers are additional defect mitigating insulating layers. In one embodiment, each of the first and second conductors is a multi-layered conductor comprising a metal layer. In one embodiment, the electrochromic device further comprises a diffusion barrier disposed on the substrate and optionally the diffusion barrier comprises one or more layers or the diffusion barrier is a tri-layer stack of SiO2, SnO2, and SiOx layers, wherein the SiO2 layer has a thickness of between 20nm and 30nm, wherein the SnO2 layer has a thickness of between 20nm and 30nm, and wherein the SiOx layer has a thickness of between 2nm and 10nm and further optionally the one or more layers of the diffusion barrier comprise at least one of silicon dioxide, silicon oxide, tin oxide, and FTO. In some cases, an overall sheet resistance of the first and second conductors is less than 10 Ω/□, less than 5 Ω/□, or less than 5 Ω/□. In one case, a resistivity of one of the first and second conductors is the range of between 150Ω-cm and about 500Ω-cm. In some cases, a sheet resistance of the first and second conductors varies by less than 20%, 10%, or 5%. In some cases, a thickness of each of the first and second conductors varies by less than 10%, 5% or 2% from a nominal thickness. In one embodiment, the metal layer is transparent.

Certain embodiments pertain to electrochromic devices comprising in the following order: a) a glass substrate, b) a first TCO layer, c) a first defect mitigating insulating layer, d) a first metal layer, e) a second defect mitigating insulating layer, f) an EC stack comprising a cathodically coloring electrode layer and an anodically coloring electrode layer sandwiching an ion conductor layer, g) a second TCO layer, h) a second metal layer, and i) a third TCO layer. In one embodiment, the glass substrate is float glass and there is a diffusion barrier between the glass substrate and the first TCO layer. In one embodiment, the first TCO layer is FTO. In one embodiment, the first and second metal layers are silver. In one embodiment, the second and third TCO layers are ITO. In one embodiment, the electrochromic device further comprises, in the following order: j) a third metal layer; and k) a fourth TCO layer, optionally wherein the third metal layer is silver and the fourth TCO layer is ITO.

Certain embodiments pertain to an electrochromic device comprising, in the following order, a substantially transparent substrate, a first multi-layer conductor disposed on the substantially transparent substrate, an electrochromic stack, and a second multi-layer conductor disposed on the electrochromic stack. The first multi-layer conductor comprises, in order, a first conductive material layer, a first defect mitigating insulating layer, a second conductive material layer, and a second defect mitigating insulating layer. The second multi-layer conductor comprises, in order, a third defect mitigating insulating layer, a third conductive material layer, a fourth defect mitigating insulating layer, and a fourth conductive material layer. In one embodiment, the electrochromic device further comprises one or more diffusion barrier layers between the substantially transparent substrate and the first multi-layer conductor.

Certain embodiments pertain to an electrochromic device comprising, in the following order, a substantially transparent substrate, a first multi-layer conductor disposed on the substantially transparent substrate, an electrochromic stack, and a second multi-layer conductor disposed on the electrochromic stack. The first multi-layer conductor comprises, in order, a first transparent conductive oxide layer, a first metal layer, a second transparent conductive oxide layer, and a first defect mitigating insulating layer. The second multi-layer conductor comprises, in order, a third transparent conductive oxide layer, a second metal layer, and a fourth transparent conductive oxide layer.

Certain embodiments pertain to an electrochromic device comprising, in the following order, a substantially transparent substrate, a first multi-layer conductor disposed on the substantially transparent substrate, an electrochromic stack, and a second multi-layer conductor disposed on the electrochromic stack. The first multi-layer conductor comprises, in order, a first transparent conductive oxide layer, a first metal layer, a second transparent conductive oxide layer, one or more blocking layers, and a first defect mitigating insulating layer. The second multi-layer conductor comprises, in order, a third transparent conductive oxide layer, a second metal layer, and a fourth transparent conductive oxide layer. In one embodiment, the electrochromic device further comprises one or more diffusion barrier layers between the substantially transparent substrate and the first multi-layer conductor.

Certain embodiments pertain to an electrochromic device comprising, in the following order a substantially transparent substrate, a first multi-layer conductor disposed on the substantially transparent substrate, an electrochromic stack, and a second multi-layer conductor disposed on the electrochromic stack. The first multi-layer conductor comprises, in order, a first transparent conductive oxide layer, a first metal layer, a protective cap layer, and a second transparent conductive oxide layer. The second multi-layer conductor comprises, in order, a third transparent conductive oxide layer, a second metal layer, and a fourth transparent conductive oxide layer.

Certain embodiments pertain to an electrochromic device comprising, in the following order: a substantially transparent substrate, a first multi-layer conductor disposed on the substantially transparent substrate, an electrochromic stack, and a second multi-layer conductor disposed on the electrochromic stack. The first multi-layer conductor comprises, in order, one or more color tuning layers, a first metal layer, and a first defect mitigating insulating layer. The second multi-layer conductor comprises, in order, a second defect mitigating insulating layer and a second metal layer. In one embodiment, the electrochromic device further comprises one or more diffusion barrier layers between the substantially transparent substrate and the first multi-layer conductor. In one embodiment, the first metal layer becomes transparent when disposed over the one or more color tuning layers. In one embodiment, the one or more color tuning layers has wavelength absorption characteristics such that light transmitted through the electrochromic device is of a predetermined spectrum. In one embodiment, the one or more color tuning layers has wavelength absorption characteristics such that light transmitted through the electrochromic device is blue.

Certain aspects of the present disclosure pertain to windows that include one or more electrochromic devices described herein.

Certain embodiments are directed to an electrochromic window configured for electromagnetic shielding (i.e. an electromagnetic-shielding, electrochromic window). In one embodiment, an electromagnetic-shielding, electrochromic window comprises a first multi-layer conductor disposed on a transparent substrate, an electrochromic stack disposed on the first conductor, and a second multi-layer conductor. One or both of the first and second multi-layer conductors comprises an electromagnetic shielding stack configured to be activated to block electromagnetic communication signals through the window. The electromagnetic shielding stack comprises a first electroconductive material layer (e.g. metal layer) sandwiched between a first anti-reflection layer (e.g., TCO, DMIL, and a second anti-reflection layer.

These and other features and embodiments will be described in more detail below with reference to the drawings.

DETAILED DESCRIPTION

Certain aspects pertain to electrochromic devices configured not only for faster switching, but also for high quality low-defect count. In some cases, the electrochromic devices have multi-layer conductors of differing materials. The different conductor material layers are configured for faster switching relative to conventional single-layer conductors, while also being optically and materially compatible with the other device layers. In other aspects, electrochromic devices are configured with one or more barrier/blocking layer and/or one or more metal alloy layers to help prevent migration of the metal into the electrochromic device for improved durability. These and other aspects are described below.

I. Electrochromic Device Structure

Before turning to a more detailed description on conductor designs and other improvements in layers of an electrochromic device, examples of the structure of an electrochromic device are provided. An electrochromic device generally comprises two conductors that sandwich an electrochromic stack. The electrochromic stack typically includes an electrochromic (EC) layer, a counter electrode (CE) layer, and optionally one or more ion conducting (IC) layers that allow ion transport but are electrically insulating. Electrochromic devices are typically deposited on a substrate, and oftentimes are depicted as fabricated on a horizontally oriented substrate, and thus for the purposes of this disclosure, the conductors of the electrochromic device are sometimes referred to as "upper" and "lower" conductors where the description makes reference to drawings that depict the conductors in this manner. In other cases, the conductors are referred to as "first" and "second" conductors.

Figure 1:
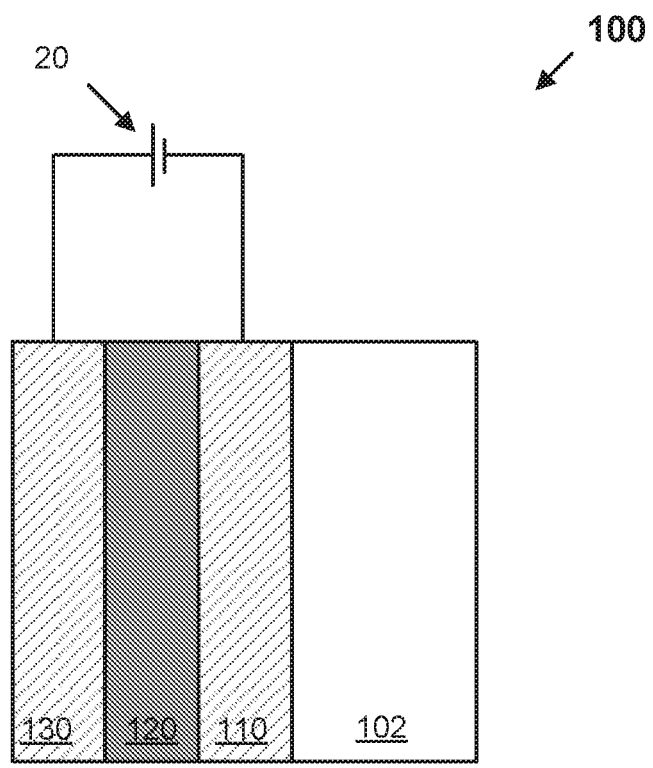
FIG. 1 depicts a schematic illustration of a cross section of an electrochromic device, according to aspects.

FIG. 1 is a schematic illustration of a cross-section of an electrochromic device 100, according to embodiments. The electrochromic device 100 comprises a substrate 102 (e.g., glass), a first conductor 110, an electrochromic stack 120, and a second conductor 130. A voltage source, 20, operable to apply an electric potential across electrochromic stack 120 effects the transition of the electrochromic device 100 between tint states such as, for example, between a bleached state and a colored state. In certain implementations, the electrochromic device 100 further comprises a diffusion barrier of one or more layers between the substrate 102 and the first conductor 110. In some cases, the substrate 102 may be fabricated with the diffusion barrier.

In certain embodiments, the electrochromic stack is a three-layer stack including an EC layer, optional IC layer that allows ion transport but is electrically insulating, and a CE layer. The EC and CE layers sandwich the IC layer. Oftentimes, but not necessarily, the EC layer is tungsten oxide based and the CE layer is nickel oxide based, e.g., being cathodically and anodically coloring, respectively. In one embodiment, the electrochromic stack is between about 100nm and about 500nm thick. In another embodiment, the electrochromic stack is between about 410nm and about 600nm thick. For example, the EC stack may include an electrochromic layer that is between about 200nm and about 250nm thick, an IC layer that is between about 10 and about 50nm thick, and a CE layer that is between about 200nm and 300nm thick.

Figure 2A:
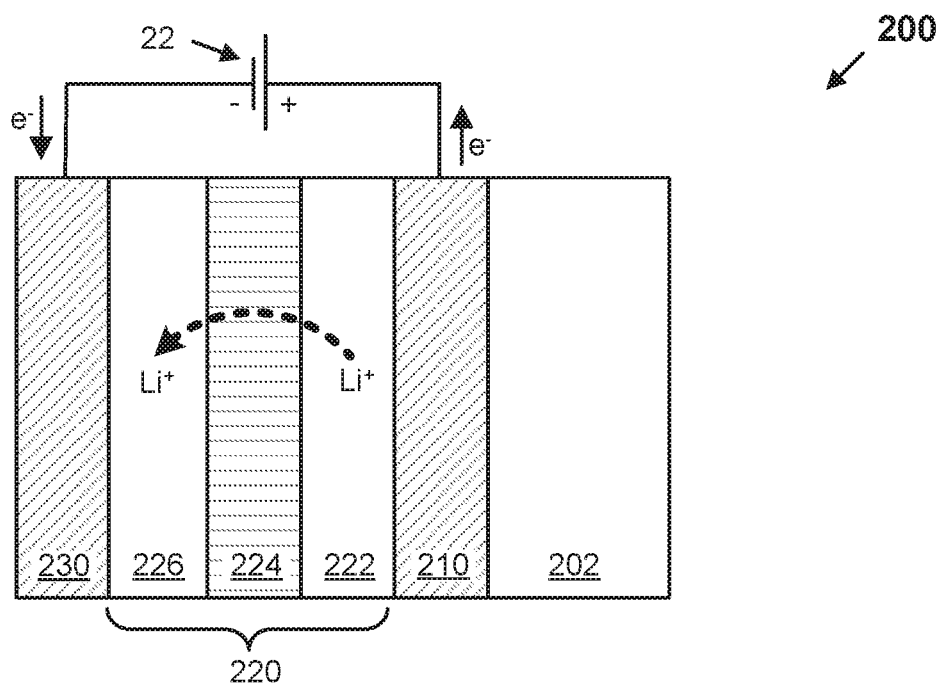
FIGS. 2A and 2B depict schematic illustrations of a cross section of an electrochromic device, according to certain aspects.
Figure 2B:
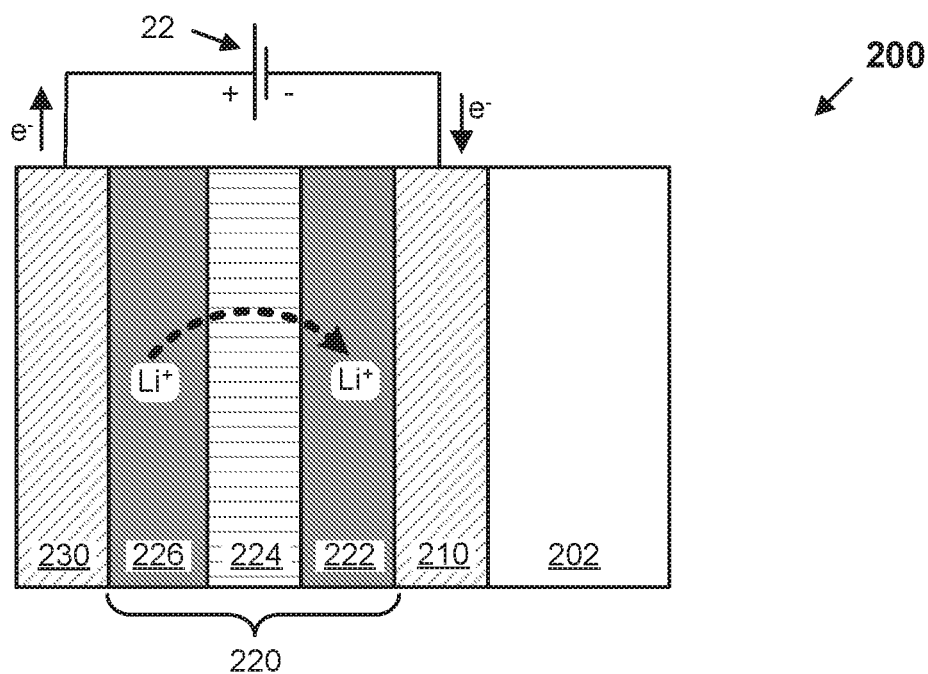

FIGS. 2A and 2B are schematic cross-sections of an electrochromic device 200, according to embodiments. The electrochromic device 200 comprises a substrate 202, a first conductor 210, an electrochromic stack 220, and a second conductor 230. The electrochromic stack 220 comprises an electrochromic layer (EC) 222, an optional ion conducting (electronically resistive) layer (IC) 224, and a counter electrode layer (CE) 226. A voltage source 22 is operable to apply a voltage potential across the electrochromic stack 220 to effect transition of the electrochromic device between tint states such as, for example, between a bleached state (refer to FIG. 2A) and a colored state (refer to FIG. 2B). In certain implementations, the electrochromic device 200 further comprises a diffusion barrier located between the substrate 202 and the first conductor 210.

In certain implementations of the electrochromic device 200 of FIGS. 2A and 2B, the order of layers in the electrochromic stack 220 may be reversed with respect to the substrate 202 and/or the position of the first and second conductors may be switched. For example, in one implementation the layers may be in the following order: substrate 202, second conductor 230, CE layer 226, optional IC layer 224, EC layer 222, and first conductor 210.

In certain implementations, the CE layer may include a material that is electrochromic or not. If both the EC layer and the CE layer employ electrochromic materials, one of them is a cathodically coloring material and the other an anodically coloring material. For example, the EC layer may employ a cathodically coloring material and the CE layer may employ an anodically coloring material. This is the case when the EC layer is a tungsten oxide and the counter electrode layer is a nickel tungsten oxide. The nickel tungsten oxide may be doped with another metal such as tin, niobium or tantalum.

During an exemplary operation of an electrochromic device (e.g. electrochromic device 100 or electrochromic device 200), the electrochromic device can reversibly cycle between a bleached state and a colored state. For simplicity, this operation is described in terms of the electrochromic device 200 shown in FIGS. 2A and 2B, but applies to other electrochromic devices described herein as well. As depicted in FIG. 2A, in the bleached state, a voltage is applied by the voltage source 22 at the first conductor 210 and second conductor 230 to apply a voltage potential across the electrochromic stack 220, which causes available ions (e.g. lithium ions) in the stack to reside primarily in the CE layer 226. If the EC layer 222 contains a cathodically coloring material, the device is in a bleached state. In certain electrochromic devices, when loaded with the available ions, the CE layer can be thought of as an ion storage layer. Referring to FIG. 2B, when the voltage potential across the electrochromic stack 220 is reversed, the ions are transported across optional IC layer 224 to the EC layer 222, which causes the material to transition to the colored state. Again, this assumes that the optically reversible material in the electrochromic device is a cathodically coloring electrochromic material. In certain embodiments, the depletion of ions from the counter electrode material causes it to color also as depicted. In other words, the counter electrode material is anodically coloring electrochromic material. Thus, the EC layer 222 and the CE layer 226 combine to synergistically reduce the amount of light transmitted through the stack. When a reverse voltage is applied to the electrochromic device 200, ions travel from the EC layer 222, through the IC layer 224, and back into the CE layer 226. As a result, the electrochromic device 200 bleaches i.e. transitions to the bleached states. In certain implementations, electrochromic devices can operate to transition not only between bleached and colored states, but also to one or more intermediate tint states between the bleached and colored states.

Some pertinent examples of electrochromic devices are presented in the following US patent applications, each of which is hereby incorporated by reference in its entirety: U.S. patent application Ser. No. 12/645,111, filed on Dec. 22, 2009; U.S. patent application Ser. No. 12/772,055, filed on Apr. 30, 2010; U.S. patent application Ser. No. 12/645, 159, filed on Dec. 22, 2009; U.S. patent application Ser. No. 12/814,279, filed on Jun. 11, 2010; and U.S. patent application Ser. No. 13/462,725, filed on May 2, 2012.

Electrochromic devices described herein such as those described with reference to FIGS. 1, 2A, 2B, 3, 4, 5A, 5B, 6, 7, and 8 can be incorporated, for example, in electrochromic windows. In these examples, the substrate is a transparent or substantially transparent substrate such as glass. For example, the substrate 102 or the substrate 202 may be architectural glass upon which electrochromic devices are fabricated. Architectural glass is glass that can be used as a building material. Architectural glass is typically used in commercial buildings, but may also be used in residential buildings, and typically, though not necessarily, separates an indoor environment from an outdoor environment. In certain embodiments, architectural glass is at least 20 inches by 20 inches. In some embodiments, architectural glass can be as large as about 72 inches by 120 inches.

As larger and larger substrates are used in electrochromic window applications, it becomes more desirable to reduce the number and extent of the defects in the electrochromic devices, otherwise performance and visual quality of the electrochromic windows may suffer. Certain embodiments described herein may reduce defectivity in electrochromic windows.

In some embodiments, one or more electrochromic devices are integrated into an insulating glass unit (IGU). An insulated glass unit comprises multiple panes (also referred to as "lites") with a spacer sealed between panes to form a sealed interior region that is thermally insulating and can contain a gas such as an inert gas. In some embodiments, an IGU includes multiple electrochromic lites, each lite having at least one electrochromic device.

In certain embodiments, an electrochromic device is fabricated by thin film deposition methods such as, e.g., sputter deposition, chemical vapor deposition, pyrolytic spray on technology and the like, including combinations of thin film deposition technologies known to one of ordinary skill in the art. In one embodiment, the electrochromic device is fabricated using all plasma vapor deposition.

In certain embodiments, an electrochromic device may further comprise one or more bus bars for applying voltage to the conductors of the electrochromic device. The bus bars are in electrical communication with a voltage source. The bus bars are typically located at one or more edges of the electrochromic device and not in the center region, for example, the viewable central area of an IGU. In some cases, the bus bars are soldered or otherwise connected to the first and second conductors to apply a voltage potential across the electrochromic stack. For example, ultrasonic soldering, which makes a low resistance connection, may be used. Bus bars may be, for example, silver ink based materials and/or include other metal or conductive materials such as graphite and the like.

II. Conductor and Other Electrochromic Device Materials

Recently, there has been increased attention paid to improving conductors for applications such as large-area electrochromic devices. Conventionally, single-layer conductors with transparent conductive oxides (TCOs) based on $In_2O_3$, ZnO, aluminum zinc oxide (AZO), fluorinated tin oxide (FTO), indium tin oxide (ITO) have been used, but advanced and/or large-area electrochromic devices require new conductors with lower resistivities than previously achieved, e.g., for faster switching speeds. A TCO/metal/TCO three-layer structure can serve as an alternative since it may provide superior electrical characteristics to that of a conventional single-layer conductor and may have improved optical properties. However, improvements are still needed with regards to this structure. For example, incorporating a TCO/metal/TCO three-layer structure into advanced electrochromic devices introduces problematic issues such as addressing optical and material compatibility with other layers of the advanced electrochromic devices. Generally speaking, recent advancements in electrochromic device design have necessitated improvements in conductors compatible with these advanced designs.

In some embodiments, electrochromic devices are configured not only for faster switching, but also to take into account the need for high quality, low-defect count electrochromic devices. In some cases, the electrochromic device conductors are configured for faster switching relative conventional single-layer TCO conductors, while also being optically and materially compatible with the other device layers.

The conductors described herein generally include one or more metal layers or one or more TCO layers, and in some embodiments, include both one or more metal layers and one or more TCO layers. The conductors having two or more layers of differing composition are sometimes referred to herein as "composite conductors" or "multi-layer conductors." In some cases, a composite conductor has two or more metal layers of differing composition. In other cases, a composite conductor has one or more metal layers and one or more TCO layers. In yet other cases, a composite conductor has two or more TCO layers. Generally, but not necessarily, the TCO materials used in conductors are high band gap metal oxides.

Some examples of TCO materials used in a TCO layer of a conductor include, but are not limited to, fluorinated tin oxide (FTO), indium tin oxide (ITO), aluminum zinc oxide (AZO) and other metal oxides, doped with one or more dopants or not, for example. In some cases, the TCO layer is between about 200nm and 500nm thick. In some cases, the TCO layer is between about 100nm and 500nm thick. In some cases, the TCO layer is between about 10nm and 100nm thick. In some cases, the TCO layer is between about 10nm and 50nm thick. In some cases, the TCO layer is between about 200nm and 500nm thick. In some cases, the TCO layer is between about 100nm and 250nm thick.

Some examples of metals used in a metal layer of a conductor include, but are not limited to, silver, copper, aluminum, gold, platinum, and mixtures, intermetallics and alloys thereof. In one embodiment, the metal layer has a thickness in the range of between about 1nm and 5nm thick. In one embodiment, the metal layer has a thickness in the range between about 5nm to about 30nm. In one embodiment, the metal layer has a thickness in the range between about 10nm and about 25nm. In one embodiment, the metal layer has a thickness in the range between about 15nm and about 25nm.

In some embodiments, a metal layer of a conductor may be comprised of a "metal sandwich" construction of two or more different metal sublayers. For example, a metal layer may comprise a "metal sandwich" construction of Cu/Ag/Cu sublayers instead of a single layer of, for example, Cu. In another example, a metal layer may comprise a "metal sandwich" construction of NiCr/metal/NiCr, where the metal sublayer is one of the aforementioned metals.

In some embodiments, a metal layer of a conductor comprises a metal alloy. Electromigration resistance of metals can be increased through alloying. Increasing the electromigration resistance of metal layers in a conductor reduces the tendency of the metal to migrate into the electrochromic stack and potentially interfere with operation of the device. By using a metal alloy, the migration of metal into the electrochromic stack can be slowed and/or reduced which can improve the durability of the electrochromic device. Certain aspects pertain to using a metal alloy in a metal layer of a conductor to help reduce the tendency of migration of the metal into the electrochromic stack and potentially improve the durability of the electrochromic device. For example, addition of small amounts of Cu or Pd to silver can substantially increase the electromigration resistance of the silver material. In one embodiment, for example, a silver alloy with Cu or Pd is used in a conductor to reduce the tendency of migration of silver into the electrochromic stack to slow down or prevent such migration from interfering with normal device operation. In some cases, the metal layer may be comprised of an alloy whose oxides have low resistivity. In one example, the metal layer may further comprise another material (e.g., Hg, Ge, Sn, Pb, As, Sb, or Bi) as compound during the preparation of the oxide to increase density and/or lower resistivity.

In some embodiments, the one or more metal layers of a composite conductor are transparent. Typically, a transparent metal layer is less than 10nm thick, for example, about 5nm thick or less. In other embodiments, the one or more metal layers of a composite conductor are opaque or not entirely transparent.

In certain embodiments, a composite conductor includes a layer of material of "opposing susceptibility" adjacent a dielectric or metal layer. A material of "opposing susceptibility," referring to the material's electric susceptibility, generally refers to a material that has susceptibility to having an opposing sign. Electric susceptibility of a material refers to its ability to polarize in an applied electric field. The greater the susceptibility, the greater the ability of the material to polarize in response to the electric field. Including a layer of "opposing susceptibility" can change the wavelength absorption characteristics to increase the transparency of the dielectric or metal layer and/or shift the wavelength transmitted through the combined layers. For example, a composite conductor can include a high-index dielectric material layer (e.g., $TiO_2$) of "opposing susceptibility" adjacent a metal layer to increase the transparency of the metal layer. In some cases, the added layer of opposing susceptibility" adjacent a metal layer can cause a not entirely transparent metal layer to be more transparent. For example, a metal layer (e.g., silver layer) that has a thickness in the range of from about 5nm to about 30nm, or between about 10nm and about 25nm, or between about 15nm and about 25nm, may not be entirely transparent by itself, but when coated with a material of "opposing susceptibility" (e.g., $TiO_2$ layer on top of the silver layer), the transmission through the combined layers is higher than the metal or dielectric layer alone. Certain aspects pertain to selecting a dielectric or metal layer and an adjacent layer of "opposing susceptibility" to color tune the electrochromic device to transmit certain wavelengths of a predetermined spectrum.

In certain embodiments, a composite conductor includes one or more metal layers and one more "color tuning" layers also referred to as "index matching" layers. These color tuning layers are generally of a high-index, low-loss dielectric material of "opposing susceptibility" to the one or more metal layers. Some examples of materials that can be used in "color tuning" layers include silicon oxide, tin oxide, indium tin oxide, and the like. In these embodiments, the thickness and/or material used in the one or more color tuning layers changes the absorption characteristics to shift the wavelength transmitted through the combination of the material layers. For example, the thickness of the one or more color tuning layers can be selected to tune the color of light transmitted through the electrochromic device in a bleached state to a predetermined spectrum (e.g., more blue over green or red). In another example, tuning layers are chosen and configured to reduce transmission of certain wavelengths (e.g., yellow) through the electrochromic device, and thus e.g. a window which includes the device coating.

Although the first and second composite conductors generally have the same or substantially similar layers and the order of the layers in the first composite conductor mirrors the order of the layers of the second composite conductor in described implementations, the disclosure is not so limiting. For example, the first composite conductor may have different layers than the second composite conductor in other embodiments. As another example, the first composite conductor may have the same layers as the second composite conductor but the order of the layers may not mirror each other.

In certain embodiments, the first and second conductors have matched sheet resistance, for example, to provide optimum switching efficiency of the electrochromic device and/or a symmetric coloration front. Matched conductors have sheet resistances that vary from each other by no more than 20% in some embodiments, in other embodiments by no more than 10%, and in yet other embodiments by no more than 5%.

For large-area electrochromic devices, e.g., those devices disposed on architectural scale substrates, that is, substrates at least 20 ×20 inches and up to 72 ×120 inches, the overall sheet resistance of each of the multi-layer conductors (including all layers of the conductor such as metal, TCO, and DMIL, if present) is typically less than 15 $\Omega/\square$, less than 10 $\Omega/\square$, less than 5 $\Omega/\square$, less than 3 $\Omega/\square$, or less than 2 $\Omega/\square$. This allows for faster switching relative to conventional devices, particularly when the sheet resistance is less than 5 $\Omega/\square$, or less than 3 $\Omega/\square$, or less than 2$\Omega/\square$. Resistivities of conductors described herein are typically measured in $\Omega$-cm. In one example, the resistivity of one or more of the multi-layer conductors may be between about 150$\Omega$-cm and about 500$\Omega$-cm. One or more of the layers of a multi-layer conductor, such as a metal layer, may have a lower resistivity.

Ideally, at least the lower conductor's topography should be smooth for better conformal layers in the deposited stack thereon. In certain embodiments, one or both of the conductors is a substantially uniform conductor layer that varies by about ±10% in thickness in some cases, or about ±5% in thickness in some cases, or even about ±2% in thickness in some cases. Although typically the thickness of conductors is about 10-800nm, the thickness will vary depending upon the materials used, thickness of individual layers and how many layers are in the conductor. For example, for composite conductors that include one or more TCOs, the TCO components can be between about 50nm and about 500nm thick while the conductor also includes one or more metal layers. In one example, the thickness of the metal layer(s) is in the range of between about 0.1nm and about 5nm thick. In one example, the thickness of the metal layer(s) is in the range of between about 1nm and about 5nm thick. In one example, the thickness of the metal layer(s) is in the range of about 5nm to about 30nm. In one example, the thickness of the metal layer(s) is in the range of between about 10nm and about 25nm. In one example, the thickness of the metal layer(s) is in the range of or between about 15nm and about 25nm.

In certain cases, the one or more metal layers of a conductor are fabricated sufficiently thin so as to be transparent in a transmissive electrochromic device. In other cases, a metal layer of a conductor is fabricated sufficiently thin to be almost transparent and then a material of "opposing susceptibility" is disposed adjacent the almost transparent metal to increase the transparency of the metal layer in transmissive electrochromic device. In cases with reflective devices, the one or more metal layers may have non-transparent metal layers without adding an adjacent layer of material of "opposing susceptibility."

Electrochromic devices described herein may include one or more defect mitigating insulating layers (DMILs) such as those described in U.S. patent application Ser. No. 13/763, 505, titled "DEFECT MITIGATION LAYERS IN ELECTROCHROMIC DEVICES" and filed on Feb. 8, 2013, which is hereby incorporated by reference in its entirety. DMIL technology includes devices and methods employing the addition of at least one DMIL. A DMIL prevents electronically conducting layers and/or electrochromically active layers from contacting layers of the opposite polarity and creating a short circuit in regions where certain types of defects form. In some embodiments, a DMIL can encapsulate particles and prevent them from ejecting from the electrochromic stack and possibly cause a short circuit when subsequent layers are deposited. In certain embodiments, a DMIL has an electronic resistivity of between about 1 and $5\times10^{10}$ Ohm-cm.

In certain embodiments, a DMIL contains one or more of the following metal oxides: cerium oxide, titanium oxide, aluminum oxide, zinc oxide, tin oxide, silicon aluminum oxide, tungsten oxide, nickel tungsten oxide, tantalum oxide, and oxidized indium tin oxide. In certain embodiments, a DMIL contains a nitride, carbide, oxynitride, or oxycarbide such as nitride, carbide, oxynitride, or oxycarbide analogs of the listed oxides, e.g., silicon aluminum oxynitride. As an example, the DMIL may include one or more of the following metal nitrides: titanium nitride, aluminum nitride, silicon nitride, and tungsten nitride. The DMIL may also contain a mixture or other combination of oxide and nitride materials (e.g., a silicon oxynitride).

The general attributes of a DMIL include transparency in the visible range, weak or no electrochromism, electronic resistance comparable to or higher than that of undoped electrode material (electrochromic and/or counter electrode), and physical and chemical durability. In certain embodiments, the DMIL has a density of at most about 90% of the maximum theoretical density of the material from which it is fabricated.

As discussed above, one of the properties of a DMIL is its electronic resistivity. Generally, a DMIL should have an electronic resistivity level that is substantially greater than that of the transparent conductive layer in the conductor, and in certain cases orders of magnitude greater. In some embodiments, the material of a DMIL has an electronic resistivity that is intermediate between that of a conventional ion conducting layer and that of a transparent conductive layer (e.g., indium doped tin oxide). In some cases, the material of a DMIL has an electronic resistivity is greater than about $10^{-4}$ $\Omega$-cm (approximate resistivity of indium tin oxide). In some cases, the material of a DMIL has an electronic resistivity is greater than about $10^{-6}$ $\Omega$-cm. In some cases, a DMIL has an electronic resistivity between about $10^{-4}$ $\Omega$-cm and $10^{14}$ $\Omega$-cm (approximate resistivity of a typical ion conductor for electrochromic devices). In some cases, the material of a DMIL has an electronic resistivity between about $10^{-5}$ $\Omega$-cm and $10^{12}$ $\Omega$-cm. In certain embodiments, the electronic resistivity of the material in the DMIL is between about 1 and $5\times10^{13}$ $\Omega$-cm. In certain embodiments, the electronic resistivity of the material in the DMIL is between about $10^2$ and $10^{12}$ $\Omega$-cm. In certain embodiments, the electronic resistivity of the material in the DMIL is between about $10^6$ and $5\times10^{12}$ $\Omega$-cm. In certain embodiments, the electronic resistivity of the material in the DMIL is between about $10^7$ and $5\times10^9$ $\Omega$-cm. In some embodiments, the material in the DMIL will have a resistivity that is comparable (e.g., within an order of magnitude) of that of the material of the electrochromic layer or the counter electrode layer of the electrochromic stack.

The electronic resistivity is coupled to the thickness of the DMIL. This resistivity and thickness level will together yield a sheet resistance value which may in fact be more important than simply the resistivity of the material alone (a thicker material will have a lower sheet resistance). When using a material having a relatively high resistivity value, the electrochromic device may be designed with a relatively thin DMIL, which may be desirable to maintain the optical quality of the device. In certain embodiments, the DMIL has a thickness of about 100nm or less or about 50nm or less. In one example, the DMIL has a thickness of about 5nm, in another example, the layer has a thickness of about 20nm, and in another example, the layer has a thickness of about 40nm. In certain embodiments, the DMIL has a thickness of between about 10nm and about 100nm. In one case, a DMIL is about 50nm thick. In certain embodiments, the electronic sheet resistance of the DMIL is between about 40 and 4000 $\Omega$ per square or between about 100 and 1000 $\Omega$ per square. In some cases, the insulating material is electrically semiconducting having a sheet resistance that cannot be easily measured.

In certain embodiments, particularly those in which a DMIL is disposed on the substrate, a thicker layer of a DMIL is sometimes employed. The thickness of the DMIL may be, for example, between about 5 and 500nm, between about 5 and 100nm, between 10 and 100nm, between about 15 and 50nm, between about 20 and 50nm, or between about 20 and 40nm.

In certain embodiments, the material making up the DMIL has a relatively low charge capacity. In the context of an electrochromic device, a material's charge capacity represents its ability to reversibly accommodate lithium ions during normal electrochromic cycling. Charge capacity is the capacity of the material to irreversibly accommodate lithium ions that it encounters during fabrication or during initial cycling. Those lithium ions that are accommodated as charge are not available for subsequent cycling in and out of the material in which they are sequestered. If the insulating material of the DMIL has a high charge capacity, then it may serve as a reservoir of nonfunctional lithium ions (typically the layer does not exhibit electrochromism so the lithium ions that pass into it do not drive a coloring or bleaching transition). Therefore, the presence of this additional layer requires additional lithium ions to be provided in the device simply to be taken up by this additional layer. This is of course a disadvantage, as lithium can be difficult to integrate into the device during fabrication. In certain embodiments, the charge capacity of the DMIL is between about 10 and 100 milliCoulomb/$cm^2$*um. In one example, the charge capacity of the DMIL is between about 30 and 60 milliCoulomb/$cm^2$. For comparison, the charge capacity of a typical nickel tungsten oxide electrochromic layer is approximately 120 milliCoulomb/$cm^2$*um. In certain embodiments, the charge capacity of a DMIL is between about 30 and 100 milliCoulomb/$cm^2$*um. In one example, the charge capacity of the DMIL is between about 100 and 110 milliCoulomb/$cm^2$*um. For comparison, the charge capacity of a typical nickel tungsten oxide electrochromic layer is typically less than about 100 milliCoulomb/$cm^2$*um.

In certain embodiments, the DMIL is ionically conductive. This is particularly the case if the layer is deposited before the counter electrode layer. In some of these embodiments, the DMIL has an ionic conductivity of between about $10^{-7}$ Siemens/cm and $10^{-12}$ Siemens/cm. In other of these embodiments, the DMIL has an ionic conductivity of between about $10^{-8}$ Siemens/cm and $10^{-11}$ Siemens/cm. In other of these embodiments, the DMIL has an ionic conductivity of between about between $10^{-9}$ Siemens/cm and $10^{-10}$ Siemens/cm.

In some implementations, the DMIL exhibits little or no electrochromism during normal operation. Electrochromism may be measured by applying a defined voltage change or other driving force and measuring the change in optical density or transmissivity of the device.

According to certain implementations, the material of the DMIL should have favorable optical properties. For example, the material of the DMIL should have a relatively low optical density such as, for example, an optical density below about 0.1 or an optical density below about 0.05. Additionally in certain cases, the material of the DMIL has a refractive index that matches that of adjacent materials in the stack so that it does not introduce significant reflection. The material should also adhere well to other materials adjacent to it in the electrochromic stack.

As discussed above, a DMIL can serve to encapsulate particles that deposit on the device during fabrication in certain embodiments. By encapsulating these particles, they are less likely to eject and potentially cause defects. In certain implementations, the fabrication operation that deposits the DMIL is performed immediately after or soon after the process operation or operations that likely introduces particles into the device. These implementations may be useful to improve encapsulating the particles and reduce defectivity in electrochromic devices. In certain implementations, thicker layers of DMILs are used. Using thicker DMILs may be particularly useful to increase encapsulating of particles and reduce defectivity in electrochromic devices.

Various insulating materials may be used in DMILs. Some of these insulating materials include various transparent metal oxides such as, for example, aluminum oxide, zinc oxide, tin oxide, silicon aluminum oxide, silicon oxide, cerium oxide, stoichiometric tungsten oxide (e.g., $WO_3$, wherein the ratio of oxygen to tungsten is exactly 3), variations of nickel tungsten oxide, and highly oxidized indium tin oxide (ITO). In some cases, the insulating material of the DMIL is selected from aluminum oxide, zinc oxide, silicon aluminum oxide, tantalum oxide, and nickel tungsten oxide (typically a non-electrochromic type). In addition, some nitrides, carbides, oxynitrides, oxycarbides, and fluorides having medium to high resistance and optical transparency can be used. For example, nitrides such as titanium nitride, tantalum nitride, aluminum nitride, silicon nitride, and/or tungsten nitride may be used. Further, carbides such as titanium carbide, aluminum carbide, tantalum carbide, silicon carbide, and/or tungsten carbide may be used. Oxycarbides and/or oxynitrides may also be used in certain embodiments. Unless otherwise specified, each of these compositions may be present in various stoichiometries or ratios of elements. For DMILs containing nickel and tungsten, the ratio of nickel to tungsten may be controlled such that relatively high ratios are employed. For example the Ni:W (atomic) ratio may be between about 90:10 and 50:50 or between about 80:20 and 60:40.

In some cases, the material chosen for the DMIL is a material that integrates well (i.e. compatible) with electrochromic stack. The integration may be promoted by (a) employing compositions similar to those of materials in layers adjacent to DMIL in the stack (promotes ease of fabrication), and (b) employing materials that are optically compatible with the other materials in the stack and reduce quality degradation in the overall stack.

In certain embodiments, the electrochromic device includes a diffusion barrier between the lower conductor and the transparent substrate (e.g., a glass substrate such as soda lime glass). The diffusion barrier may include one or more layers. The diffusion barrier layer or layers keep sodium ions from diffusing into the electrochromic device layers above it and may also, optionally, be optically tuned to enhance various optical properties of the entire construct, e.g., % optical transmission (% T), haze, color, reflection and the like.

In one embodiment, the diffusion barrier includes one or more layers including one more of, for example, silicon dioxide, silicon oxide, tin oxide, FTO and the like. In certain aspects, the diffusion barrier is a three-layer stack of $SiO_2$, $SnO_2$, and $SiO_x$, wherein the $SiO_2$ layer has a thickness in the range of between 20nm and 30nm, the a $SnO_2$ layer has a thickness in the range of between 20 and 30nm, and the $SiO_x$ layer has a thickness in the range of 2nm to 10nm. In one aspect, the $SiO_x$ layer of the tri-layer diffusion barrier is a monoxide or a mix of the monoxide with $SiO_2$. In one aspect, the tri-layer diffusion barrier may be sandwiched between an FTO and the substrate. In certain aspects, the diffusion barrier is in a bi-layer or tri-layer construction of $SnO_2$, $SiO_2$ and $SiO_x$ in various combinations. In one embodiment, thicknesses of individual diffusion barrier layers may be in the range between about 10nm and 30nm. In certain cases, thicknesses of individual diffusion barrier layers may be in the range of 20nm-30nm. In some cases, the diffusion barrier may be a sodium diffusion barrier and/or an anti-reflection or anti-iridescent layer.

In certain implementations, the electrochromic device has a diffusion barrier between the lower conductor and the substrate. In other implementations, the electrochromic device does not have a diffusion barrier. In some cases, a diffusion barrier may not be necessary and is not used. For example, if the substrate is a sodium free substrate such as plastic or alkali free glass, the diffusion barrier is optional. In other examples, an electrochromic device may have one or more color tuning layers over the substrate that function as a diffusion barrier.

III. Composite Conductors Examples

This section includes examples of electrochromic devices having one or more composite conductors, according to embodiments. In certain implementations, the electrochromic stacks and other layers of the electrochromic devices described in this section may have similar characteristics to layers described in the sections above. For example, the layers of the electrochromic stacks described in this section may be similar in some respects to the layers described with reference to FIGS. 2A and 2B in Section I. As another example, the characteristics of the DMILs described in this section are described in detail in Section II.

Conductive Material/DMIL1/Conductive Material/DMIL2

In certain embodiments, a composite conductor comprises material layers with the order of: a first conductive material layer, a first DMIL adjacent the first conductive material layer, a second conductive material layer adjacent the first DMIL, and a second DMIL adjacent the second conductive material layer. In these embodiments, the first conductive material layer is a metal layer or a TCO layer and the second conductive material layer is a metal layer or a TCO layer. In certain examples, both the first and second conductive material layers are metal layers. In other examples, both the first and second conductive material layers are a TCO layers. In other examples, the first or second conductive material layer is a TCO layer and the other conductive material layer is a metal layer. An example of a composite conductor with material layers, in order, of: a first conductive material layer, a first DMIL, a second conductive material layer, and a second DMIL is shown in FIG. 3.

Figure 3:
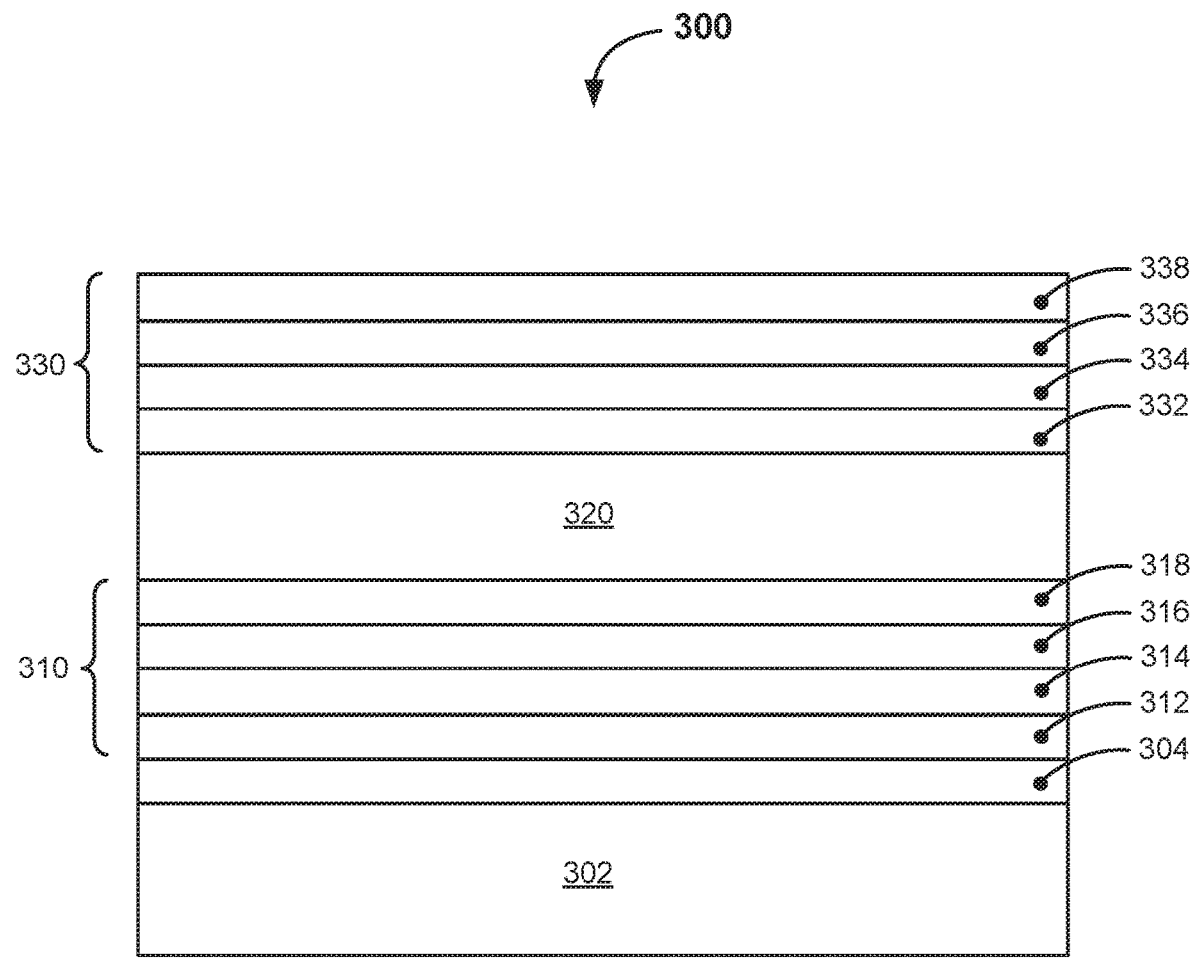
FIG. 3 depicts a schematic illustration of a cross section of an electrochromic device comprising in order a substrate, a diffusion barrier, a first composite conductor with a first conductive (metal or TCO) material layer, a first DMIL, a second conductive (metal or TCO) material layer, and a second DMIL and a second composite conductor with mirrored layers to first composite conductor, according to embodiments.

FIG. 3 depicts a schematic illustration of the material layers of an electrochromic device 300, according to embodiments. The electrochromic device 300 comprises a substrate 302, one or more diffusion barrier layers 304 disposed on the substrate 302, a first composite conductor 310 disposed on the diffusion barrier layer(s) 304, an electrochromic stack 320 disposed on the first composite conductor 310, and a second composite conductor 330 disposed on the electrochromic stack 320. The first composite conductor 310 comprises a first conductive material layer 312, a first DMIL 314, a second conductive material layer 316, and a second DMIL 318. The second composite conductor 330 comprises a third DMIL 314, a third conductive material layer 334, a fourth DMIL 336, and a fourth conductive material layer 338. The first conductive material layer 312 and the fourth conductive material layer 338 are either a metal layer or a TCO layer. The second conductive material layer 316 and the third conductive material layer 334 are either a metal layer or a TCO layer. In one example, the first conductive material layer 312 is a TCO layer and the second conductive material layer 316 is a metal layer. In another example, the first conductive material layer 312 is a metal layer and the second conductive material layer 316 is a TCO layer. In another example, both the first conductive material layer 312 and the second conductive material layer 316 are made of metal. In another example, both the first conductive material layer 312 and the second conductive material layer 316 are made of a TCO.

If the first conductive material layer 312 is made of a TCO, then the layer is made of any of the materials described above for TCOs and has the associated electrical, physical and optical properties of the TCO materials as described above. If the first conductive material layer 312 is made of a metal, then the layer may be made of any of the metal materials as described above for metal layers, including alloys, intermetallics, mixtures and/or layers of metals, and having the electrical, physical and optical properties of the metals as described above. In one embodiment where the first conductive material layer 312 is made of a metal, the thickness is between about 1 nm and 5 nm thick. In one embodiment where the first conductive material layer 312 is made of a metal, the thickness is between about 5nm to about 30nm. In one embodiment where the first conductive material layer 312 is made of a metal, the thickness is between about 10nm and about 25nm. In one embodiment where the first conductive material layer 312 is made of a metal, the thickness is between about 15nm and about 25nm. In one embodiment, the first conductive material layer 312 is made of a silver metal. The first DMIL 314 may be made of any of the materials described above for DMILs and has the associated electrical, physical and optical properties of the DMIL materials as described above. In one embodiment, the first DMIL 314 is of $TiO_2$. In one case, the first DMIL 314 of $TiO_2$ is between 10nm and 100nm thick. In another case, the first DMIL 314 of $TiO_2$ is between 25nm and 75nm thick. In another case, the first DMIL 314 of $TiO_2$ is between 40nm and 60nm thick. In yet another case, the first DMIL 314 of $TiO_2$ is about 50nm thick.

If the second conductive material layer 316 is made of a TCO, then the layer is made of any of the materials described above for TCOs and has the associated electrical, physical and optical properties of the TCO materials as described above. If the second conductive material layer 316 is made of a metal, then the layer may be made of any of the metal materials as described above for metal layers, including alloys, intermetallics, mixtures and/or layers of metals, and having the electrical, physical and optical properties of the metals as described above. In one embodiment where the second conductive material layer 316 is made of a metal, the thickness is between about 1nm and 5nm thick. In one embodiment where the second conductive material layer 316 is made of a metal, the thickness is between about 5nm to about 30nm. In one embodiment where the second conductive material layer 316 is made of a metal, the thickness is between about 10nm and about 25nm. In one embodiment where the second conductive material layer 316 is made of a metal, the thickness is between about 15nm and about 25nm. In one embodiment, the second conductive material layer 316 is made of a silver metal.

The second DMIL 318 may be made of any of the materials described above for DMILs and has the associated electrical, physical and optical properties of the DMIL materials as described above. In one embodiment, the second DMIL 318 is of $TiO_2$. In one case, the second DMIL 318 of $TiO_2$ is between 10nm and 100nm thick. In another case, the second DMIL 318 of $TiO_2$ is between 25nm and 75nm thick. In another case, the second DMIL 318 of $TiO_2$ is between 40nm and 60nm thick. In yet another case, the second DMIL 318 of $TiO_2$ is about 50nm thick.

The third DMIL 314 may be made of any of the materials described above for DMILs and has the associated electrical, physical and optical properties of the DMIL materials as described above. In one embodiment, the third DMIL 314 is of $TiO_2$. In one case, the third DMIL 314 of $TiO_2$ is between 10nm and 100nm thick. In another case, the third DMIL 314 of $TiO_2$ is between 25nm and 75nm thick. In another case, the third DMIL 314 of $TiO_2$ is between 40nm and 60nm thick. In yet another case, the third DMIL 314 of $TiO_2$ is about 50nm thick.

The fourth DMIL 336 may be made of any of the materials described above for DMILs and has the associated electrical, physical and optical properties of the DMIL materials as described above. In one embodiment, fourth DMIL 336 is of TiO$_2$. In one case, fourth DMIL 336 of TiO$_2$ is between 10nm and 100nm thick. In another case, the fourth DMIL 336 of TiO$_2$ is between 25nm and 75nm thick. In another case, the fourth DMIL 336 of TiO$_2$ is between 40nm and 60nm thick. In yet another case, the fourth DMIL 336 of TiO$_2$ is about 50nm thick.

If the third conductive material layer 334 is made of a TCO, then the layer is made of any of the materials described above for TCOs and has the associated electrical, physical and optical properties of the TCO materials as described above. If the third conductive material layer 334 is made of a metal, then the layer may be made of any of the metal materials as described above for metal layers, including alloys, intermetallics, mixtures and/or layers of metals, and having the electrical, physical and optical properties of the metals as described above. In one embodiment where the third conductive material layer 334 is made of a metal, the thickness is between about 1 nm and 5 nm thick. In one embodiment where the third conductive material layer 334 is made of a metal, the thickness is between about 5nm to about 30nm. In one embodiment where the third conductive material layer 334 is made of a metal, the thickness is between about 10nm and about 25nm. In one embodiment where the third conductive material layer 334 is made of a metal, the thickness is between about 15nm and about 25nm. In one embodiment, the third conductive material layer 334 is made of a silver metal.

If the fourth conductive material layer 338 is made of a TCO, then the layer is made of any of the materials described above for TCOs and has the associated electrical, physical and optical properties of the TCO materials as described above. If the fourth conductive material layer 338 is made of a metal, then the layer may be made of any of the metal materials as described above for metal layers, including alloys, intermetallics, mixtures and/or layers of metals, and having the electrical, physical and optical properties of the metals as described above. In one case, the fourth conductive material layer 338 is silver and is between about 1nm and 5nm thick. In one embodiment where the fourth conductive material layer 338 is made of a metal, the thickness is between about 1nm and 5nm thick. In one embodiment where the fourth conductive material layer 338 is made of a metal, the thickness is between about 5nm to about 30nm. In one embodiment where the fourth conductive material layer 338 is made of a metal, the thickness is between about 10nm and about 25nm. In one embodiment where the fourth conductive material layer 338 is made of a metal, the thickness is between about 15nm and about 25nm. In one embodiment, the fourth conductive material layer 338 is made of a silver metal.

In the illustrated embodiment, the first and second composite conductors 310 and 330 have the same or substantially similar material layers as each other with a mirrored layout. That is, the third DMIL 332 is the same or substantially similar to the second DMIL 318, the fourth DMIL 336 is the same or substantially similar to the first DMIL 314, the first conductive material layer 312 is the same or substantially similar to the fourth conductive material layer 338, and the second conductive material layer 316 is the same or substantially similar to the third conductive material layer 334. In other embodiments, the first and second composite conductors 310 and 330 may have different orders of the same layers. In yet other embodiments, the first and second composite conductors 310 and 330 have different material layers. Although the electrochromic device 300 is shown in with diffusion barrier layer(s) 304, another embodiment omits it.

In certain aspects, the first composite conductor 310 of the electrochromic device 300 shown in FIG. 3 further comprises one or more color tuning layers located between the substrate 302 and the first conductive material layer 312. In these aspects, the first conductive material layer 312 is made of metal. In some of these aspects, the color tuning layer(s) is substituted for the diffusion barrier 304. In these color tuning embodiments, the one or more color tuning layers may be selected to increase transparency of the conductor and/or to modify the wavelength of light passing through the electrochromic device to change the color of light transmitted. Some examples of materials that can be used in color tuning layers are silicon oxide, tin oxide, indium tin oxide, and the like.

Various Layers with "Opposing Susceptibility"

Figure 4:
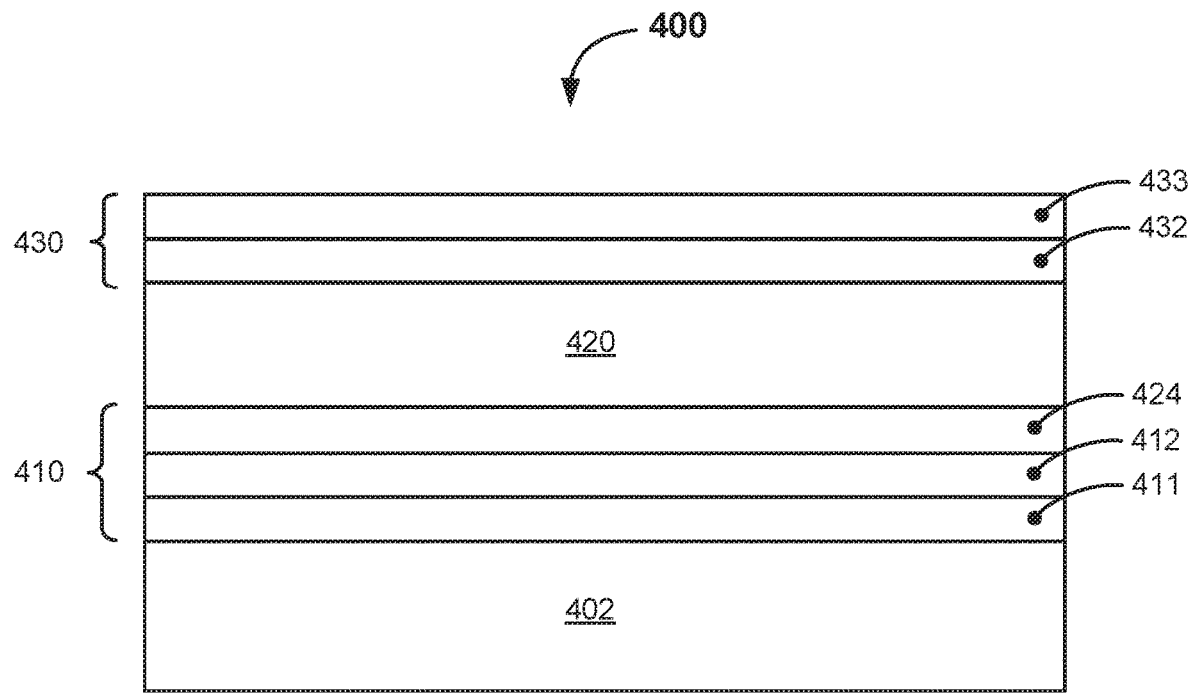
FIG. 4 depicts a schematic illustration of a cross section of an electrochromic device with a composite conductor having one or more color tuning layers, according to aspects.

In certain embodiments, the materials used in one or more of the diffusion barrier layer(s), color tuning layer(s) and DMIL layer(s) are selected based on "opposing susceptibility" to adjacent layers to increase the transparency of the electrochromic device and/or tune the wavelength of light transmitted through the electrochromic device to a predetermined spectrum. For example, the materials may be selected to transmit a range of wavelengths associated with blue light through the electrochromic device. In some cases, the materials are selected to shift the range of wavelengths away from green or red. An example of a construction of an electrochromic device with a composite conductor comprising one or more color tuning layers is shown in FIG. 4. In this example, the electrochromic device 400 does not have a separate diffusion barrier disposed on the substrate 402.

FIG. 4 depicts a schematic illustration of an electrochromic device 400 comprising a substrate 402, a first composite conductor 410 disposed on the substrate 402, an electrochromic stack 420 disposed on the first composite conductor 410, and a second composite conductor 430 disposed on the electrochromic stack 420. The first composite conductor 410 comprises one or more color tuning layers 411, a metal layer (e.g., silver) 412 disposed on the one or more color tuning layers 411, and a first DMIL (e.g., TiO$_2$) 424 disposed on the metal layer 412. The second composite conductor 420 comprises a second DMIL 432 disposed on the EC stack 420, and a second metal layer 433. In another embodiment, the order of the layers in either or both of the composite conductors 410 and 430 may be reversed.

In certain implementations, the second DMIL 432 is the same or substantially similar to the first DMIL 424 and/or the second metal layer 433 is the same or substantially similar to the first metal layer 412. In other embodiments, the first composite conductor 410 and/or the second composite conductor 430 have additional layers. For example, one or more color tuning layers may be added to the second composite conductor 430. As another example, a diffusion barrier may be added between the one or more color tuning layers 411 and the substrate 402.

The one or more color tuning layers 411 is made of any of the materials described above for color tuning layers. The first metal layer 412 is made of any of the metal materials as described above for metal layers, including alloys, intermetallics, mixtures and/or layers of metals, and having the electrical, physical and optical properties of the metals as described above. In one embodiment, the first metal layer 412 has a thickness in a range of between about 1nm and about 5nm. In one embodiment, the first metal layer 412 has a thickness in a range of between about 5nm and about 30nm. In one embodiment, the first metal layer 412 has a thickness in a range of between about 10nm and about 25nm. In one embodiment, the first metal layer 412 has a thickness in a range of between about 15nm and about 25nm. In one embodiment, the first metal layer 412 is made of silver.

The first DMIL 424 may be made of any of the materials described above for DMILs and has the associated electrical, physical and optical properties of the DMIL materials as described above. In one embodiment, the first DMIL 424 is of $TiO_2$. In one case, first DMIL 424 of $TiO_2$ is between 10nm and 100nm thick. In another case, the first DMIL 424 of $TiO_2$ is between 25nm and 75nm thick. In another case, the first DMIL 424 of $TiO_2$ is between 40nm and 60nm thick. In yet another case, the first DMIL 424 of $TiO_2$ is about 50nm thick.

The second metal layer 433 is made of any of the metal materials as described above for metal layers, including alloys, intermetallics, mixtures and/or layers of metals, and having the electrical, physical and optical properties of the metals as described above. In one embodiment, the second metal layer 433 is silver, for example, having a thickness between about 1nm and 5nm thick. In one embodiment, the second metal layer 433 has a thickness between about 1nm and about 5nm thick. In one embodiment, the second metal layer 433 has a thickness between about 5nm and about 30nm. In one embodiment, the second metal layer 433 has a thickness between about 10nm and about 25nm. In one embodiment, the second metal layer 433 has a thickness between about 15nm and about 25nm.

The second DMIL 432 may be made of any of the materials described above for DMILs and has the associated electrical, physical and optical properties of the DMIL materials as described above. In one embodiment, the second DMIL 432 is of $TiO_2$. In one case, second DMIL 432 of $TiO_2$ is between 10nm and 100nm thick. In another case, the second DMIL 432 of $TiO_2$ is between 25nm and 75nm thick. In another case, the second DMIL 432 of $TiO_2$ is between 40nm and 60nm thick. In yet another case, the second DMIL 432 of $TiO_2$ is about 50nm thick.

In certain embodiments, one or more of the layers of materials describe herein can serve multiple functions. For example, in one embodiment, a layer disposed on the substrate function both as a diffusion barrier and an opposite susceptibility layer. Also, a layer can function both as a DMIL layer and an opposite susceptibility layer.

DMIL Between TCO/Metal/TCO Conductor and Electrochromic Stack

In certain embodiments, an electrochromic device has a lower composite conductor comprising a TCO (e.g., ITO)/Metal/TCO (e.g., ITO) stack also referred to as an "IMI stack" and a DMIL (e.g., $TiO_2$) between the IMI stack and the electrochromic stack. An example of such an electrochromic device is shown in FIG. 5. In these embodiments, the DMIL layer may improve durability of the electrochromic device. There may be a DMIL between each IMI, of two, and an EC stack that is sandwiched therebetween, that is, IMI/DMIL/EC stack/DMIL/IMI, optionally with color tuning and/or diffusion barrier layers between that structure and the substrate.

Figure 5A:
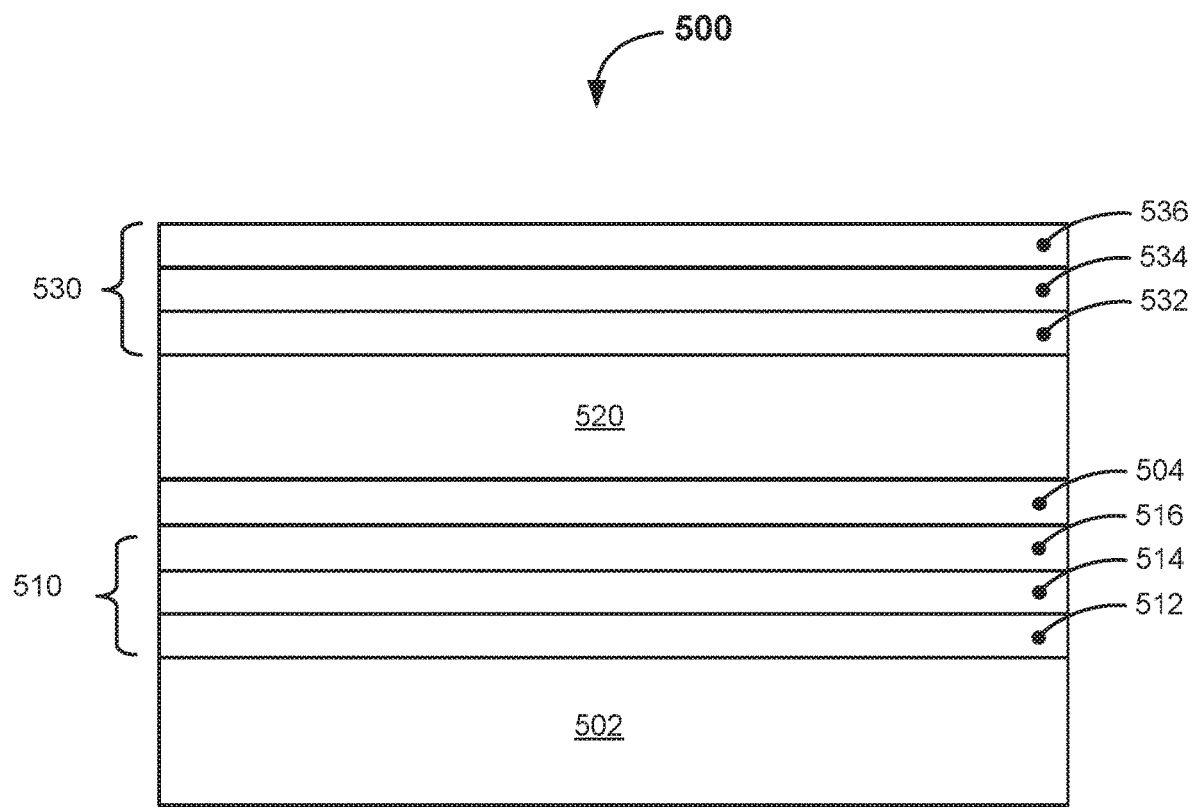
FIG. 5A depicts a schematic illustration of a cross section of an electrochromic device with a composite conductor having a DMIL between a TCO/Metal/TCO stack and the electrochromic stack, according to aspects.
Figure 5B:
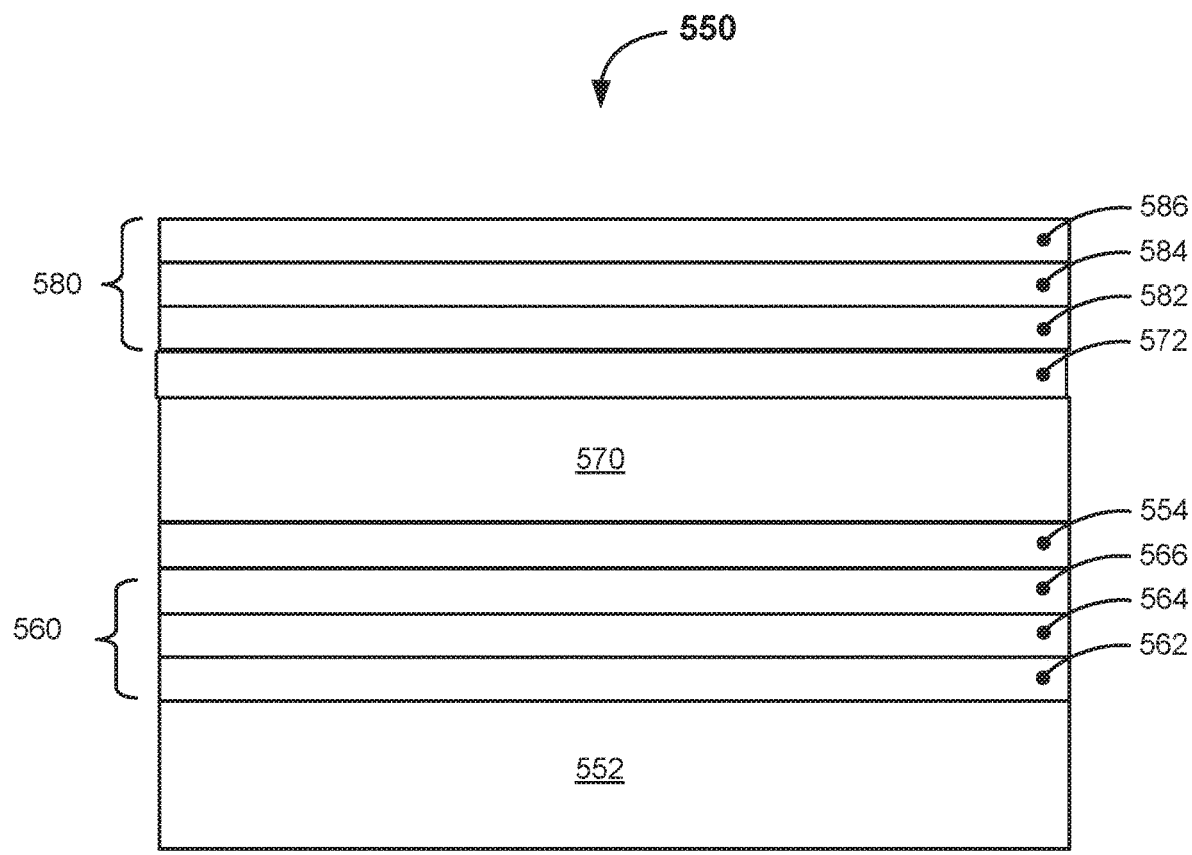
FIG. 5B depicts a schematic illustration of a cross section of an electrochromic device with a composite conductor having a DMIL between a TCO/Metal/TCO stack and the electrochromic stack, according to aspects.

FIG. 5A depicts a schematic illustration of an electrochromic device 500 comprising a substrate 502, a first composite conductor 510 disposed on the substrate 502, a DMIL 504 disposed on the first composite conductor 510, an electrochromic stack 520 disposed on the DMIL 504, and a second composite conductor 530 disposed on the electrochromic stack 520. The first composite conductor 510 comprises a first TCO layer 512 disposed on the substrate 502, a first metal layer (e.g., silver) 514 disposed on the first TCO layer 512, and a second TCO layer 516 disposed on the first metal layer 514. The second composite conductor 530 comprises a third TCO layer 532 disposed on the electrochromic stack 520, a second metal layer (e.g., silver) 534 disposed on the third TCO layer 532, and a fourth TCO layer 536 disposed on the second metal layer 534. Another embodiment also includes a second DMIL between EC stack and the third TCO layer as shown in FIG. 5B.

In one implementation, the first and second composite conductors 510 and 530 have the same or substantially similar material layers in a mirrored arrangement. That is, the fourth TCO 536 is the same or substantially similar to the first TCO layer 512, the third TCO layer 532 is the same or substantially similar to the second TCO layer 516, and the first metal layer 514 is the same or substantially similar to the second metal layer 534. In other embodiments, the first and second composite conductors 510 and 530 may have different orders of the same layers. In yet other embodiments, the first and second composite conductors 510 and 530 may have one more different material layers. In certain aspects, the first composite conductor 510 and/or the second composite conductor 530 have one or more color tuning layers.

The first TCO layer 512 is made of any of the materials described above for TCOs and has the associated electrical, physical and optical properties of the TCO materials as described above. In one embodiment, the first TCO layer 512 is a FTO layer between about 200nm and 500nm thick. The first metal layer (e.g., silver) 514 is made of any of the metal materials as described above for metal layers, including alloys, intermetallics, mixtures and/or layers of metals, and having the electrical, physical and optical properties of the metals as described above. In one embodiment, the first metal layer 514 is silver. In one embodiment, the first metal layer 514 has a thickness in the range of about 1nm and about 5nm. In one embodiment, the first metal layer 514 has a thickness in the range of about 5nm to about 30nm. In one embodiment, the first metal layer 514 has a thickness in the range of about 10nm and about 25nm. In one embodiment, the first metal layer 514 has a thickness in the range of about 15nm and about 25nm.

The second TCO layer 516 is made of any of the materials described above for TCOs and has the associated electrical, physical and optical properties of the TCO materials as described above. In one embodiment, the second TCO layer 516 is a FTO layer between about 200nm and 500nm thick. The third TCO layer 532 is made of any of the materials described above for TCOs and has the associated electrical, physical and optical properties of the TCO materials as described above. In one embodiment, the third TCO layer 532 is a FTO layer between about 200nm and 500nm thick. The second metal layer 534 is made of any of the metal materials as described above for metal layers, including alloys, intermetallics, mixtures and/or layers of metals, and having the electrical, physical and optical properties of the metals as described above. In one embodiment, the second metal layer 534 is silver. In one embodiment, the second metal layer 534 has a thickness in the range of between about 1nm and about 5nm thick. In one embodiment, the second metal layer 534 has a thickness in the range of between about 5nm to about 30nm. In one embodiment, the second metal layer 534 has a thickness in the range of between about 10nm and about 25nm. In one embodiment, the second metal layer 534 has a thickness between about 15nm and about 25nm.

The fourth TCO layer 536 is made of any of the materials described above for TCOs and has the associated electrical, physical and optical properties of the TCO materials as described above. In one embodiment, the fourth TCO layer 536 is a FTO layer between about 200nm and 500nm thick. The first DMIL 504 may be made of any of the materials described above for DMILs and has the associated electrical, physical and optical properties of the DMIL materials as described above. In one embodiment, the first DMIL 504 is of $TiO_2$. In one case, the first DMIL 504 of $TiO_2$ is between 10nm and 100nm thick. In another case, the first DMIL 504 of $TiO_2$ is between 25nm and 75nm thick. In another case, the first DMIL 504 of $TiO_2$ is between 40nm and 60nm thick. In yet another case, the first DMIL 504 of $TiO_2$ is about 50nm thick.

FIG. 5B depicts a schematic illustration of an electrochromic device 500 comprising a substrate 552, a first composite conductor 560 disposed on the substrate 552, a first DMIL 554 disposed on the first composite conductor 550, an electrochromic stack 570 disposed on the first DMIL 554, a second DMIL 572 disposed on the electrochromic stack 520, and a second composite conductor 580 disposed on the second DMIL 572. The first composite conductor 560 comprises a first TCO layer 562 disposed on the substrate 552, a first metal layer (e.g., silver) 564 disposed on the first TCO layer 562, and a second TCO layer 566 disposed on the first metal layer 564. The second composite conductor 580 comprises a third TCO layer 582 disposed on the second DMIL 572, a second metal layer (e.g., silver) 584 disposed on the third TCO layer 582, and a fourth TCO layer 586 disposed on the second metal layer 584.

In one implementation, the first and second composite conductors 560 and 580 have the same or substantially similar material layers in a mirrored arrangement. That is, the fourth TCO 586 is the same or substantially similar to the first TCO layer 562, the third TCO layer 532 is the same or substantially similar to the second TCO layer 566, and the first metal layer 564 is the same or substantially similar to the second metal layer 584. In other embodiments, the first and second composite conductors 560 and 580 may have different orders of the same layers. In yet other embodiments, the first and second composite conductors 560 and 580 may have one more different material layers. In certain aspects, the first composite conductor 560 and/or the second composite conductor 580 have one or more color tuning layers.

The first TCO layer 562 is made of any of the materials described above for TCOs and has the associated electrical, physical and optical properties of the TCO materials as described above. In one embodiment, the first TCO layer 562 is a FTO layer between about 200nm and 500nm thick. The first metal layer (e.g., silver) 564 is made of any of the metal materials as described above for metal layers, including alloys, intermetallics, mixtures and/or layers of metals, and having the electrical, physical and optical properties of the metals as described above. In one embodiment, the first metal layer 564 is silver. In one embodiment, the first metal layer 564 has a thickness in the range of about 1nm and about 5nm. In one embodiment, the first metal layer 564 has a thickness in the range of about 5nm to about 30nm. In one embodiment, the first metal layer 564 has a thickness in the range of about 10nm and about 25nm. In one embodiment, the first metal layer 564 has a thickness in the range of about 15nm and about 25nm.

The second TCO layer 570 is made of any of the materials described above for TCOs and has the associated electrical, physical and optical properties of the TCO materials as described above. In one embodiment, the second TCO layer 570 is a FTO layer between about 200nm and 500nm thick. The third TCO layer 582 is made of any of the materials described above for TCOs and has the associated electrical, physical and optical properties of the TCO materials as described above. In one embodiment, the third TCO layer 582 is a FTO layer between about 200nm and 500 nm thick. The second metal layer 584 is made of any of the metal materials as described above for metal layers, including alloys, intermetallics, mixtures and/or layers of metals, and having the electrical, physical and optical properties of the metals as described above. In one embodiment, the second metal layer 584 is silver. In one embodiment, the second metal layer 584 has a thickness in the range of between about 1nm and about 5nm thick. In one embodiment, the second metal layer 584 has a thickness in the range of between about 5nm to about 30nm. In one embodiment, the second metal layer 584 has a thickness in the range of between about 10nm and about 25nm. In one embodiment, the second metal layer 584 has a thickness between about 15nm and about 25nm.

The fourth TCO layer 586 is made of any of the materials described above for TCOs and has the associated electrical, physical and optical properties of the TCO materials as described above. In one embodiment, the fourth TCO layer 586 is a FTO layer between about 200nm and 500nm thick. The first DMIL 584 may be made of any of the materials described above for DMILs and has the associated electrical, physical and optical properties of the DMIL materials as described above. In one embodiment, the first DMIL 584 is of $TiO_2$. In one case, the first DMIL 584 of $TiO_2$ is between 10nm and 100nm thick. In another case, the first DMIL 584 of $TiO_2$ is between 25nm and 75nm thick. In another case, the first DMIL 584 of $TiO_2$ is between 40nm and 60nm thick. In yet another case, the first DMIL 584 of $TiO_2$ is about 50nm thick.

The second DMIL 572 may be made of any of the materials described above for DMILs and has the associated electrical, physical and optical properties of the DMIL materials as described above. In one embodiment, the second DMIL 572 is of $TiO_2$. In one case, the second DMIL 572 of $TiO_2$ is between 10nm and 100nm thick. In another case, the second DMIL 572 of $TiO_2$ is between 25nm and 75nm thick. In another case, the second DMIL 572 of $TiO_2$ is between 40nm and 60nm thick. In yet another case, the second DMIL 572 of $TiO_2$ is about 50nm thick. In one embodiment, the second DMIL 572 has the same characteristics of first DMIL 554.

Barrier/Blocking Layer(s)

In certain embodiments, an electrochromic device includes one or more barrier or blocking layers disposed between the lower conductor and the electrochromic stack to help prevent diffusion of metal into the electrochromic stack. Some examples of materials that can be used in such barrier or blocking layers are tantalum nitride, titanium nitride, silicon nitride, silicon oxynitride and the like, which can serve to block migration of silver from the lower conductor into the electrochromic stack. Titanium nitride and tantalum nitride, e.g., are particularly good barrier layers to prevent metal migration. An example of an electrochromic device with one or more barrier or blocking layers disposed between the lower conductor and the electrochromic stack is shown in FIG. 6.

Figure 6:
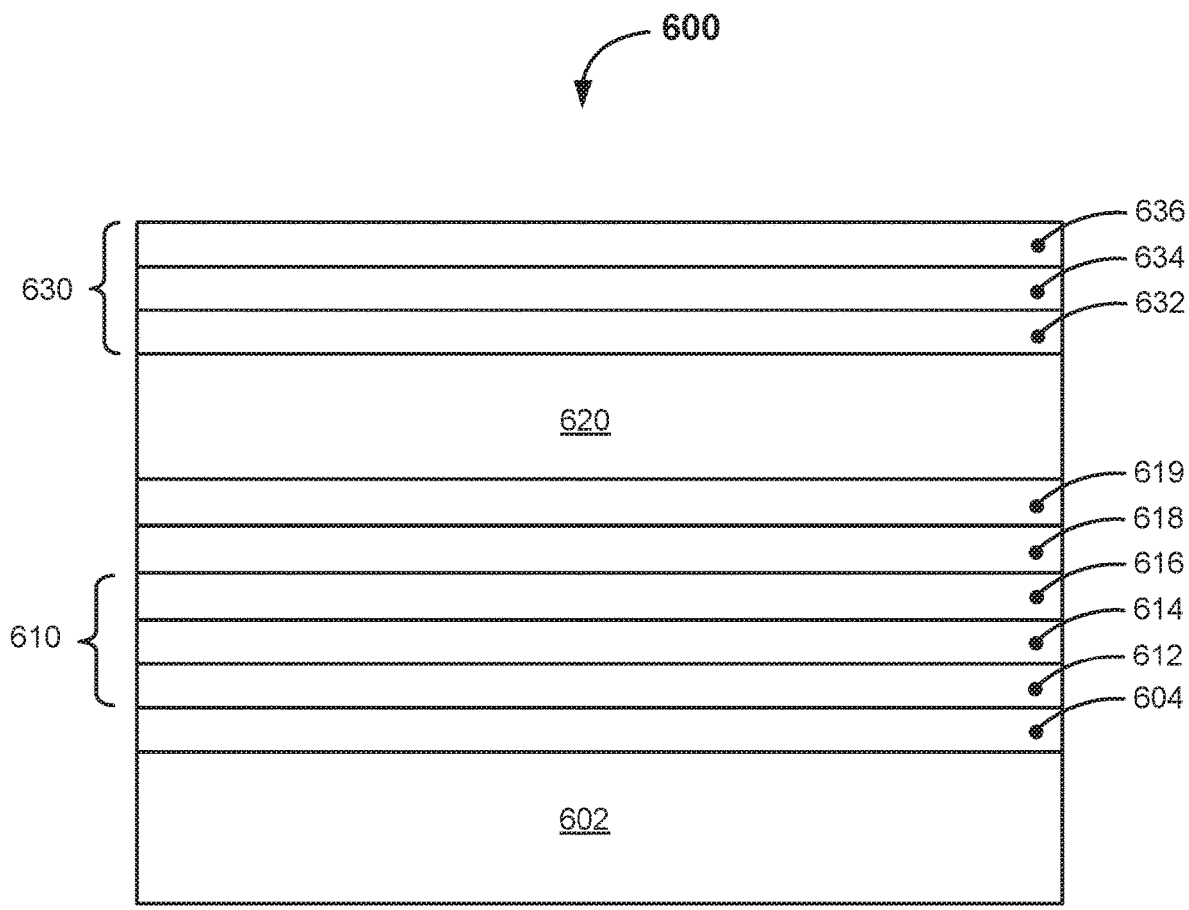
FIG. 6 depicts a schematic illustration of a cross section of an electrochromic device with one or more barrier/blocking layer, according to aspects.

FIG. 6 depicts a schematic illustration of an electrochromic device 600, according to embodiments. The electrochromic device 600 comprises a substrate 602, one or more diffusion barrier layers 604 disposed on the substrate 602, a first composite conductor 610 disposed on the diffusion barrier layer(s) 604, one or more barrier/blocking layers 618 (e.g., material layers of TaN or TiN) disposed on the a first composite conductor 610, a first DMIL 619 (e.g., $TiO_2$) disposed on the one or more barrier/blocking layers 618, an electrochromic stack 620 disposed on the first DMIL 619, and a second composite conductor 630 disposed on the electrochromic stack 620. The first composite conductor 610 comprises a first TCO layer 612 (e.g., ITO layer) disposed on the one or more diffusion barrier layers 604, a first metal layer 614 (e.g., silver layer) disposed on the first TCO layer 612, and a second TCO layer 616 disposed on the first metal layer 614. The second composite conductor 630 comprises a third TCO layer 632 disposed on electrochromic stack 620, a second metal layer 634 disposed on the third TCO layer 632, and a fourth TCO layer 636 disposed on the second metal layer 634. The one or more barrier/blocking layers 618 are between the first DMIL 619 and the second TCO layer 616 to provide a barrier for diffusion into the electrochromic stack 620. For example, if the metal layer 614 is a silver layer and the one or more barrier/blocking layers 618 comprise TaN or TiN, then the TaN or TiN barrier/blocking layers 618 can block migration of silver into the electrochromic stack 620.

The first TCO layer 612 is made of any of the materials described above for TCOs and has the associated electrical, physical and optical properties of the TCO materials as described above. In one embodiment, the first TCO layer 612 is a FTO layer between about 200nm and 500nm thick. The first metal layer 614 is made of any of the metal materials as described above for metal layers, including alloys, intermetallics, mixtures and/or layers of metals, and having the electrical, physical and optical properties of the metals as described above. In one embodiment, the first metal layer 614 is silver. In one embodiment, the first metal layer 614 has a thickness in the range of between about 1nm and 5nm thick. In one embodiment, the first metal layer 614 has a thickness in the range of between about is about 5nm to about 30nm. In one embodiment, the first metal layer 614 has a thickness in the range of between about 10nm and about 25nm. In one embodiment, the first metal layer 614 has a thickness in the range of between about 15nm and about 25nm.

The second TCO layer 616 is made of any of the materials described above for TCOs and has the associated electrical, physical and optical properties of the TCO materials as described above. In one embodiment, the second TCO layer 616 is a FTO layer between about 200nm and 500nm thick. The third TCO layer 632 is made of any of the materials described above for TCOs and has the associated electrical, physical and optical properties of the TCO materials as described above. In one embodiment, the third TCO layer 632 is a FTO layer between about 200nm and 500nm thick. The second metal layer 634 is made of any of the metal materials as described above for metal layers, including alloys, intermetallics, mixtures and/or layers of metals, and having the electrical, physical and optical properties of the metals as described above. In one embodiment, the second metal layer 634 is silver. In one embodiment, the second metal layer 634 has a thickness in the range of between about 1nm and 5nm thick. In one embodiment, the second metal layer 634 has a thickness in the range of between about 5nm and about 30nm. In one embodiment, the second metal layer 634 has a thickness in the range of between about 10nm and about 25nm. In one embodiment, the second metal layer 634 has a thickness in the range of between about 15nm and about 25nm.

The fourth TCO layer 636 is made of any of the materials described above for TCOs and has the associated electrical, physical and optical properties of the TCO materials as described above. In one embodiment, the fourth TCO layer 636 is a FTO layer between about 200nm and 500nm thick. The barrier/blocking layers 618 is made of materials described above for barrier/blocking layers and has all the associated electrical, physical and optical properties of the barrier/blocking layers. The first DMIL 619 may be made of any of the materials described above for DMILs and has the associated electrical, physical and optical properties of the DMIL materials as described above. In one embodiment, the first DMIL 619 is of $TiO_2$. In one case, the first DMIL 619 of $TiO_2$ is between 10nm and 100nm thick. In another case, the first DMIL 619 of $TiO_2$ is about 50nm thick. In one case, the first DMIL 619 of $TiO_2$ is between 10nm and 100nm thick. In another case, the first DMIL 619 of $TiO_2$ is between 25nm and 75nm thick. In another case, the first DMIL 619 of $TiO_2$ is between 40nm and 60nm thick. In yet another case, the first DMIL 619 of $TiO_2$ is about 50nm thick.

In one implementation, the first and second composite conductors 610 and 630 have the same or substantially similar material layers with the illustrated mirrored layout. That is, the first TCO layer 612 is the same or substantially similar to the fourth TCO layer 636, the first metal layer 614 is the same or substantially similar to the second metal layer 634, and the second TCO layer is the same or substantially similar to the third TCO layer 632. In other embodiments, the first and second composite conductors may have different orders of the same layers. In yet other embodiments, the first and second composite conductors may have one more different material layers. In certain implementations, the electrochromic device 600 omits the diffusion barrier 604. In certain aspects, the first and/or second composite conductor 610, 630 of the electrochromic device 600 shown in FIG. 6 further comprises one or more color tuning layers adjacent the metal layers.

Protective Cap

In certain embodiments, an electrochromic device includes a protective cap layer on top of a key conductive layer (e.g., metal layer) to protect it from being damaged during one or more fabrication operations. For example, a key conductive layer may be of aluminum, which is readily oxidized to aluminum oxide during fabrication operations such as those that include high temperature such as a heat treatment process. Oxidation of an aluminum conductive layer can make it a poor conductor, particularly if the aluminum layer is thin. Certain aspects pertain to fabricating a protective cap layer, such as a titanium protective cap layer, over the aluminum conductive layer to protect it during fabrication. Using titanium metal as a protective cap layer has the benefit that the titanium oxidized to $TiO_2$, which generates a DMIL layer while simultaneously protecting the underlying aluminum from oxidation.

Figure 7:
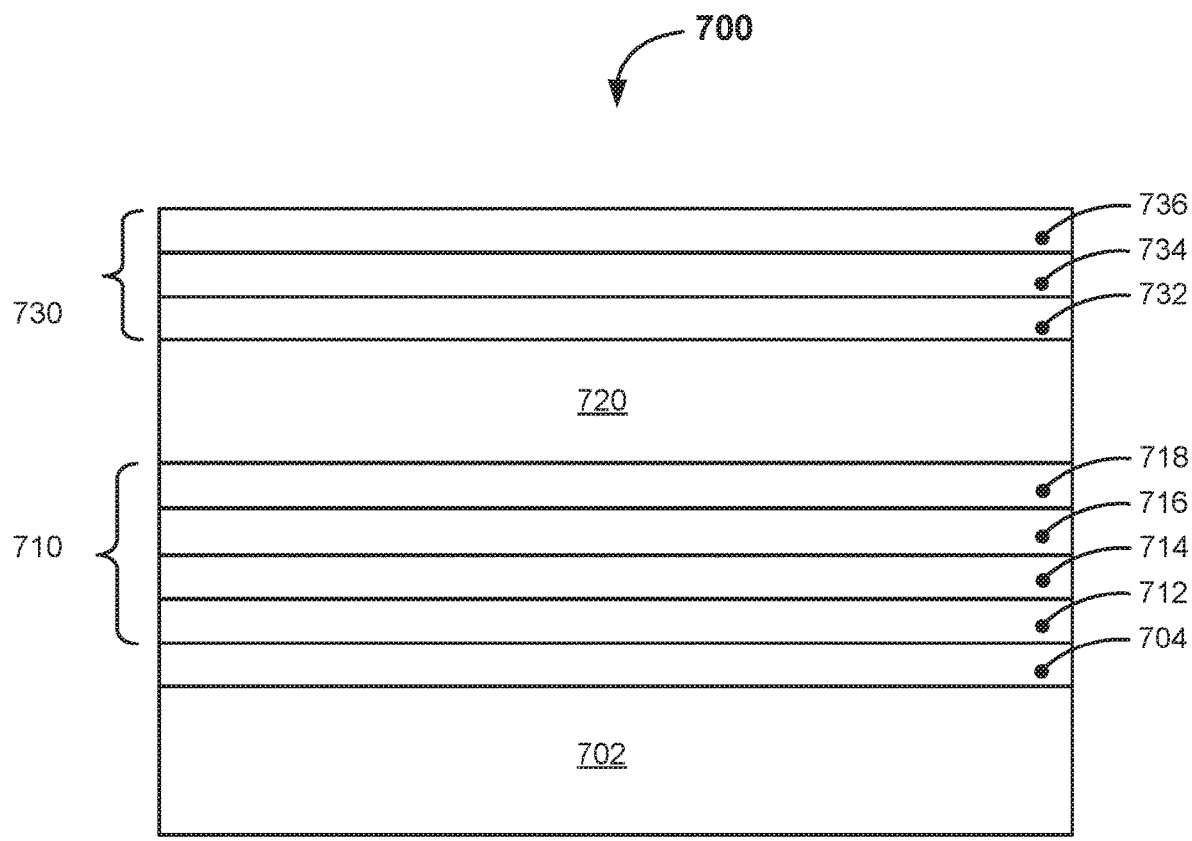
FIG. 7 depicts a schematic illustration of a cross section of an electrochromic device with a protective cap, according to aspects.

FIG. 7 depicts a schematic illustration of an electrochromic device 700 comprising a substrate 702, one or more diffusion barrier layers 704 disposed on the substrate 702, a first composite conductor 710 disposed on the diffusion barrier layer(s) 704, an electrochromic stack 720 disposed on the first composite conductor 710, and a second composite conductor 730 disposed on the electrochromic stack 720. The first composite conductor 710 comprises a first TCO layer 712 disposed on the one or more diffusion barrier layers 704, a first metal layer (e.g., silver) 714 disposed on the first TCO layer 712, a protective cap layer 716 disposed on the first metal layer 714, and a second TCO layer 718 disposed on the protective cap layer 716. If the protective cap layer is of material such as titanium that oxidizes to generate a DMIL during a fabrication operation, then a DMIL layer (not shown) may be formed at the interface to the second TCO 718. The second composite conductor 530 comprises a third TCO layer 732 disposed on the electrochromic stack 720, a second metal layer (e.g., silver) 734 disposed on the third TCO layer 732, and a fourth TCO layer 736 disposed on the second metal layer 734.

The first TCO layer 712 is made of any of the materials described above for TCOs and has the associated electrical, physical and optical properties of the TCO materials as described above. In one embodiment, the first TCO layer 712 is a FTO layer between about 200nm and 500nm thick. The first metal layer 714 is made of any of the metal materials as described above for metal layers, including alloys, intermetallics, mixtures and/or layers of metals, and having the electrical, physical and optical properties of the metals as described above. In one embodiment, the first metal layer 714 is silver. In one embodiment, the first metal layer 714 has a thickness in the range of between about 1nm and 5nm thick. In one embodiment, the first metal layer 714 has a thickness in the range of between about 5nm and about 30nm. In one embodiment, the first metal layer 714 has a thickness in the range of between about 10nm and about 25nm. In one embodiment, the first metal layer 714 has a thickness in the range of between about 15nm and about 25nm.

The protective cap layer 716 may be made of any of the materials described above for protective cap materials and has the associated electrical, physical and optical properties of the protective cap materials as described above. The second TCO layer 718 is made of any of the materials described above for TCOs and has the associated electrical, physical and optical properties of the TCO materials as described above. In one embodiment, the second TCO layer 718 is a FTO layer between about 200nm and 500nm thick. The third TCO layer 732 is made of any of the materials described above for TCOs and has the associated electrical, physical and optical properties of the TCO materials as described above. In one embodiment, the third TCO layer 732 is a FTO layer between about 200nm and 500nm thick. The second metal layer 734 is made of any of the metal materials as described above for metal layers, including alloys, intermetallics, mixtures and/or layers of metals, and having the electrical, physical and optical properties of the metals as described above. In one embodiment, the second metal layer 734 is silver. In one embodiment, the second metal layer 734 has a thickness in the range of between about 1nm and 5nm thick. In one embodiment, the second metal layer 734 has a thickness in the range of between about 5nm and about 30nm. In one embodiment, the second metal layer 734 has a thickness in the range of between about 10nm and about 25nm. In one embodiment, the second metal layer 734 has a thickness in the range of between about 15nm and about 25nm.

The fourth TCO layer 736 is made of any of the materials described above for TCOs and has the associated electrical, physical and optical properties of the TCO materials as described above. In one embodiment, the fourth TCO layer 736 is a FTO layer between about 200nm and 500nm thick.

In one implementation, the first and second composite conductors 710 and 730 have the same or substantially similar material layers in a mirrored arrangement. That is, the fourth TCO 736 is the same or substantially similar to the first TCO layer 712, the third TCO layer 732 is the same or substantially similar to the second TCO layer 716, and the first metal layer 714 is the same or substantially similar to the second metal layer 734. In other embodiments, the first and second composite conductors 710 and 730 may have different orders of the same layers. In yet other embodiments, the first and second composite conductors 710 and 730 may have one more different material layers. In certain aspects, the first composite conductor 710 and/or the second composite conductor 740 have one or more color tuning layers.

Other Examples of Multi-Layer Lower Conductors

Figure 8:
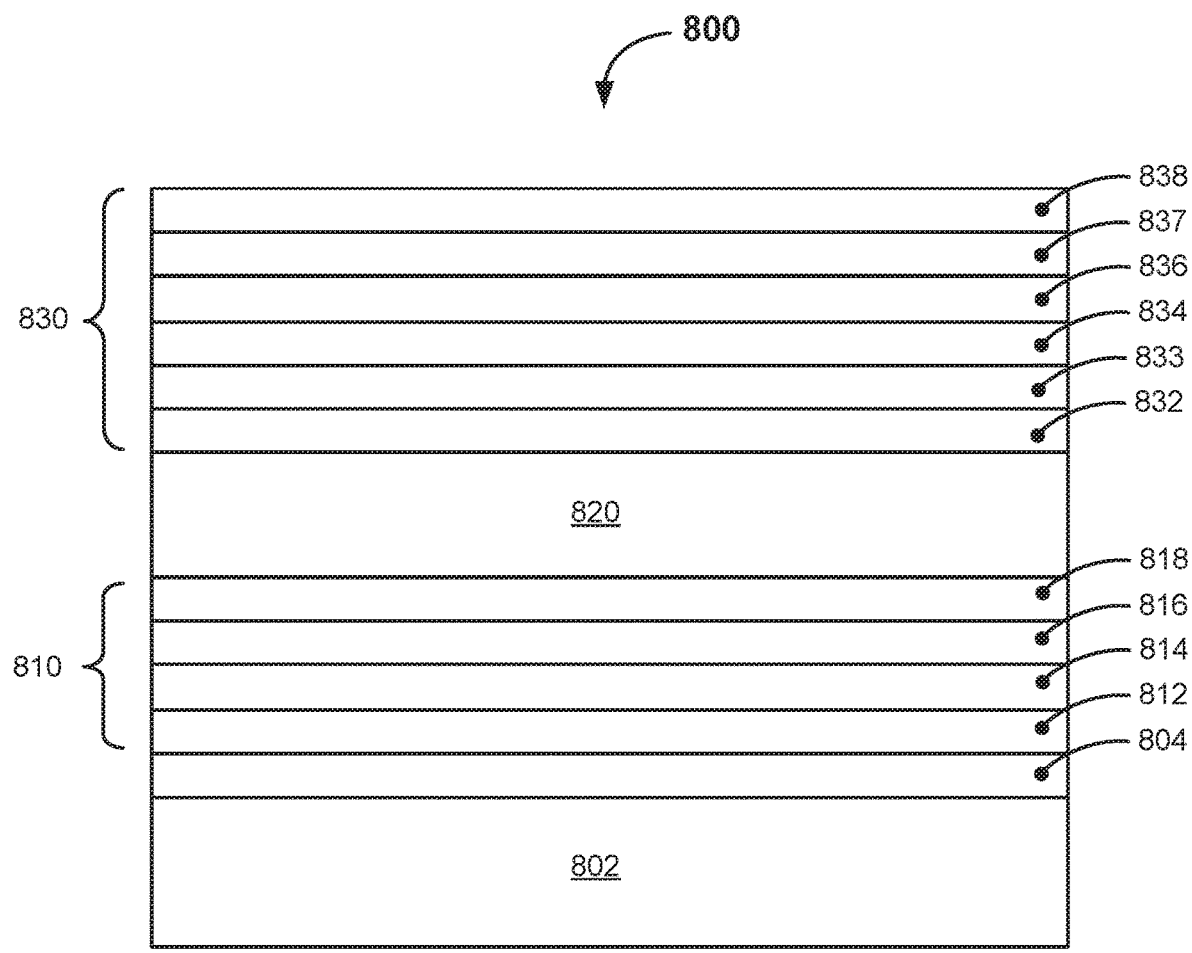
FIG. 8 depicts a schematic illustration of a cross section of an electrochromic device with multi-layer conductors, according to embodiments.

FIG. 8 is an example used to illustrate various other embodiments of multi-layer conductors. FIG. 8 depicts a schematic illustration of the material layers of an electrochromic device 800, according to embodiments. The electrochromic device 800 comprises a substrate 802, one or more diffusion barrier layers 804 disposed on the substrate 802, a first composite conductor 810 disposed on the diffusion barrier layer(s) 804, an electrochromic stack 820 disposed on the first composite conductor 810, and a second composite conductor 830 disposed on the electrochromic stack 820. The first composite conductor 810 comprises a first TCO layer 812 disposed over the one or more diffusion barrier layers 804, a first DMIL 814 disposed over the first TCO layer 812, a first metal layer 816 disposed over the first DMIL 814, and a second DMIL 818 disposed over the first metal layer 816. The second composite conductor 830 comprises an optional third DMIL 832 shown disposed over the electrochromic stack 820, a second TCO 833 disposed over the third DMIL 832, a second metal layer 834 disposed over the second TCO 833, a third TCO 836 disposed over the second metal layer 834, an optional third metal layer 837 disposed over the third TCO 836, and an optional fourth TCO 838 disposed over the third metal layer 837.

In certain aspects, the first composite conductor 810 of the electrochromic device 800 shown in FIG. 8 further comprises one or more color tuning layers located adjacent one or more of the metal layers. In these color tuning embodiments, the one or more color tuning layers may be selected to increase transparency of the conductor and/or to modify the wavelength of light passing through the electrochromic device to change the color of light transmitted. Some examples of materials that can be used in color tuning layers are silicon oxide, tin oxide, indium tin oxide, and the like.

The first TCO layer 812 is made of any of the materials described above for TCOs and has the associated electrical, physical and optical properties of the TCO materials as described above. In one embodiment, the first TCO layer 812 is a FTO layer between about 200nm and 500nm thick.

The first DMIL 814 may be made of any of the materials described above for DMILs and has the associated electrical, physical and optical properties of the DMIL materials as described above. In one embodiment, the first DMIL 814 is of $TiO_2$. In one case, the first DMIL 814 of $TiO_2$ is between 10nm and 100nm thick. In another case, the first DMIL 814 of $TiO_2$ is between 25nm and 75nm thick. In another case, the first DMIL 814 of $TiO_2$ is between 40nm and 60nm thick. In yet another case, the first DMIL 814 of $TiO_2$ is about 50nm thick.

The first metal layer 816 is made of any of the metal materials as described above for metal layers, including alloys, intermetallics, mixtures and/or layers of metals, and having the electrical, physical and optical properties of the metals as described above. In one embodiment, the first metal layer 816 is silver. In one embodiment, the first metal layer 816 has a thickness in the range of between about 1nm and 5nm thick. In one embodiment, the first metal layer 816 has a thickness in the range of between about 5nm and about 30nm. In one embodiment, the first metal layer 816 has a thickness in the range of between about 10nm and about 25nm. In one embodiment, the first metal layer 816 has a thickness in the range of between about 15nm and about 25nm.

A function of the second DMIL 818 is to prevent metal from the first metal layer 816 from migrating and exposure to the electrochromic stack 820. For example, the electrochromic device 800 may be lithium, proton or other ion based in some cases. Such electrochromic devices undergo oxidation/reduction reactions at their electrode layers. The second DMIL 818 protects the first metal layer 816 from oxidation and reduction reactions, particularly oxidation. The second DMIL 818 can be made of any of the materials described above for DMILs and has the electrical, physical and optical properties of DMILs as described above. In one embodiment, the second DMIL 818 is $TiO_2$. In one case, the second DMIL 818 of $TiO_2$ is between 10nm and 100nm thick. In another case, the second DMIL 818 of $TiO_2$ is between 25nm and 75nm thick. In another case, the second DMIL 818 of $TiO_2$ is between 40nm and 60nm thick. In yet another case, the second DMIL 818 of $TiO_2$ is about 50nm thick.

The third DMIL 832 is an optional layer. The third DMIL 832 may function to prevent the second TCO layer 833 from exposure to the electrochromic stack 820 and/or may function as a traditional DMIL. In one embodiment, the third DMIL 832 is NiWO and is between about 10nm and about 100. In another embodiment, the third DMIL 832 is NiWO and is between about 10 nm and about 50nm thick.

The second TCO layer 833 may be made of any of the materials described above for TCOs and has the associated electrical, physical and optical properties of the TCO materials as described above. In one embodiment, the second TCO layer 833 is ITO and is between about 10nm and about 100nm thick. In one embodiment, the second TCO layer 833 is ITO and is between about 25nm and about 75nm thick. In one embodiment, the second TCO layer 833 is ITO and is about 50nm thick.

The second metal layer 834 is made of any of the metal materials as described above for metal layers, including alloys, intermetallics, mixtures and/or layers of metals, and having the electrical, physical and optical properties of the metals as described above. In one embodiment, the second metal layer 834 is silver. In one embodiment, the second metal layer 834 has a thickness in the range of between about 1nm and 5nm thick. In one embodiment, the second metal layer 834 has a thickness in the range of between about 5nm and about 30nm. In one embodiment, the second metal layer 834 has a thickness in the range of between about 10nm and about 25nm. In one embodiment, the second metal layer 834 has a thickness in the range of between about 15nm and about 25nm.

The third TCO layer 836 may be made of any of the materials described above for TCOs and has the associated electrical, physical and optical properties of the TCO materials as described above. In one embodiment, the third TCO layer 836 is ITO and is between about 50nm and about 500nm thick. In one embodiment, the third TCO layer 836 is ITO and is between about 100nm and about 500nm thick. In one embodiment, the third TCO layer 836 is ITO and is between about 100nm thick and about 250nm thick.

The third metal layer 837 is optional. If this third metal layer 837 is included, then the optional fourth TCO layer 838 is also included. The third metal layer 837 is made of any of the metal materials as described above for metal layers, including alloys, intermetallics, mixtures and/or layers of metals, and having the electrical, physical and optical properties of the metals as described above. In one embodiment, the third metal layer 837 is silver. In one embodiment, the third metal layer 837 has a thickness in the range of between about 1nm and 5nm thick. In one embodiment, the third metal layer 837 has a thickness in the range of between about 5nm and about 30nm. In one embodiment, the third metal layer 837 has a thickness in the range of between about 10nm and about 25nm. In one embodiment, the third metal layer 837 has a thickness in the range of between about 15nm and about 25nm.

The fourth TCO layer 838 is optional. If the fourth TCO layer 838 is included, then the third metal layer 837 is also included. The fourth TCO layer 838 may be made of any of the materials described above for TCOs and has the associated electrical, physical and optical properties of the TCO materials as described above. In one embodiment, the fourth TCO layer 838 is ITO and is between about 50 nm and about 500nm thick. In one embodiment, the fourth TCO layer 838 is ITO and is between about 100nm and about 500nm thick. In one embodiment, the fourth TCO layer 838 is ITO and is between about 100nm thick and about 250nm thick.

In certain aspects, an electrochromic device comprises two conductors, at least one of which is a multi-layer conductor, and an electrochromic stack between the conductors, disposed on a substrate (e.g., glass). Each multi-layer conductor comprises a metal layer sandwiched between at least two non-metal layers such as, for example, a metal oxide layer, a transparent conductive oxide (TCO) layer and/or a DMIL. That is, a metal layer is not in direct contact with the electrochromic stack. In some cases, one or both of the conductors further comprise one or more additional metal layers. In these aspects, the additional metal layers are also sandwiched between layers and not in contact with the electrochromic stack. In some aspects, the one or more metal layers of a multi-layer conductor are not in contact with a TCO layer. For example, a metal layer of a multi-layer conductor may be sandwiched between two DMILs.

In certain aspects, a multi-layer conductor may comprise a metal layer sandwiched between a DMIL and a non-metal layer. In some cases, the sandwiched metal layer may comprise of one of silver, gold, copper, platinum, and alloys thereof. In some cases, the metal layer may be comprised of an alloy whose oxides have low resistivity. In one example, the metal layer may further comprise another material (e.g., Hg, Ge, Sn, Pb, As, Sb, or Bi) as compound during the preparation of the oxide to increase density and/or lower resistivity.

Layers of Multi-Layer Lower Conductors with Multiple Functions

In certain embodiments, one or more of the layers of materials described herein can serve multiple functions. For example, in one embodiment, a layer disposed on the substrate function both as a diffusion barrier and an opposite susceptibility layer. Also, a layer can function both as a DMIL layer and as an opposite susceptibility layer.

Electromagnetic-Shielding

In certain embodiments, a faster-switching electrochromic window with one or more electrochromic devices described herein is configured to provide electromagnetic shielding by blocking electromagnetic communication signals. Each of these electromagnetic-shielding, electrochromic windows has a shielding stack of one or more material layers that functions to block the electromagnetic communication signals. In certain aspects, the shielding stack and the electrochromic device share certain layers of a single multi-functional stack of material layers. For example, an electrochromic device may include a composite conductor with material layers that can function as a shielding stack. In other aspects, the layers of the electrochromic device and the shielding stack are separate structures on the same substrate, separate structures on different substrates (e.g., different substrates of an IGU), or separate structures on different surfaces of the same substrate.

One embodiment is an electrochromic device having one or more layers that function as an electromagnetic shield. In one embodiment, the electromagnetic shielding function is active, i.e. it can be turned on and off with a grounding function, e.g. by a controller. In one embodiment the electromagnetic shielding function is passive, i.e. always on. This may be because the layers inherently possess a shielding function by design, i.e. they do not rely on a grounding function, or e.g. because a layer or layers is permanently grounded. One embodiment is an electrochromic device stack and electromagnetic shield combination, whether the electromagnetic shield is part of the electrochromic device stack or a separate device.

These electromagnetic-shielding, electrochromic windows can be used to prevent electromagnetic interference (EMI), allowing for sensitive electromagnetic transmissions to be observed in the shielded space, or to block wireless communication and create private spaces in which outside devices are prevented from eavesdropping on wireless transmissions originating from within the space. Electrochromic windows configured to provide electromagnetic shielding for a structure or building, can effectively turn a building, room, or other space into a Faraday cage, provided the surrounding structure itself attenuates electromagnetic signals (e.g., the surrounding structure is made from conductive materials such as steel or aluminum or is properly grounded so as to block as a Faraday cage would otherwise). Electrochromic windows configured for electromagnetic shielding may be characterized as sufficiently attenuating electromagnetic transmissions across a range of frequencies, for example, between 20 MHz and 10,000 MHz. Some applications may allow more limited or selective attenuation. For example, depending on the structure of the shielding feature, one or more subranges may be excluded from attenuation. For example, in some embodiments, electromagnetic radiation may be attenuated by about 10dB to 70dB over selected ranges or about 20dB to 50dB over selected ranges.

Electromagnetic-shielding, electrochromic windows can be placed in a room of other region of a building that requires security to prevent wireless electromagnetic communications from entering or exiting the region. A window controller can be used to activate and deactivate the shielding features in the secure region according to a schedule or as triggered by an event such as the entry of particular individual or asset into the secure region or into the vicinity of the secure region. The window controller may issue the instructions over a window communications network or locally, for example, from a local onboard controller at the window. In one aspect, the shielding stack has at least one metal layer, for example, as part of a multi-layer conductor of an electrochromic device. To activate the shielding feature, the metal layer of the shielding stack may be grounded to effectively block communications. In one aspect, the same window controller that controls the transition of the electrochromic device(s) to different tint states also controls the shielding features of the window ("active" shielding). In one example, the shielding stack is selectively controlled to shield or not with a grounding function. The grounding function may be controlled by the window controller that also controls transitioning of the electrochromic device to different tint states. In other embodiments, the shielding function may be inherent in the structure of the shielding stack, i.e. a grounding function need not be applied in order to effect a shielding function (referred to as "passive" shielding).

The shielding stack of an electromagnetic-shielding, electrochromic window is designed to attenuate transmission of electromagnetic radiation in frequencies used for wireless communication while transmitting most radiation in the visible spectrum. The shielding generally includes one or more layers of electrically conductive material (i.e. one or more electroconductive layers) that span the area where transmission of electromagnetic radiation is to be blocked. For example, the one or more electroconductive layers may be coextensive with the surface area (or visible area between the window frames) of the transparent substrate upon which it is disposed in order to provide attenuation of the electromagnetic radiation. In some cases, the attenuating effect of the window can be increased when the one or more electroconductive layers are grounded or held at a particular voltage to provide attenuation of electromagnetic radiation. In some cases, the one or more electroconductive layers are not connected to ground or an external circuit and have a floating potential. Electromagnetic shielding for other window applications has previously been described in, for example, U.S. Pat. Nos. 5,139,850 and 5,147,694.

In one aspect, an electromagnetic-shielding, electrochromic window is configured to selectively block certain wavelengths of electromagnetic communication, thus acting as high, low, or bandpass filters. In other words, the shielding stack can be configured to block transmission and/or reception of communications in certain frequency ranges but allow communications in other frequency ranges, which may be deemed sufficiently secure in some contexts. For example, it may be possible to allow communication that is transmitted at 800 MHz, while blocking Wi-Fi communication.

The electroconductive layer can be made of any of a number of conductive materials such as silver, copper, gold, nickel, aluminum, chromium, platinum, and mixtures, intermetallics and alloys thereof. In some cases, the electroconductive layer may be comprised of multiple layers of the same or different conductive materials. For example, an electroconductive layer of a shielding stack may be of a "metal sandwich" construction of two or more different metal sublayers (e.g., Cu/Ag/Cu or NiCr/metal/NiCr where the metal sublayer is one of the aforementioned metals).

In one aspect, a shielding stack includes one or more silver electroconductive layers that have a floating electric potential, where each silver layer has a thickness of about 10 nm-20 nm. The shielding stack also includes anti-reflection layers made of indium tin oxide. The anti-reflection layers have a thickness of about 30 nm to 40 nm when adjacent to one silver electroconductive layer and a thickness of about 75 nm-85 nm when interposed between two silver electroconductive layers.

In some cases, the one or more electroconductive layers of a shielding stack are made of an opaque or reflective material (e.g., metal layers) in its bulk form. For example, the one or more electroconductive layers of a shielding stack may be the one or more metal layers of a composite conductor (e.g., 310, 330, 410, 430, 510, 530, 560, 580) of an electrochromic device (e.g. 300, 400, 500, 550, etc.). In one aspect, the shielding stack may be designed to minimize attenuation of visible radiation while still strongly attenuating radiation at longer wavelengths commonly used in wireless communication according to one aspect. One way to minimize attenuation of visible radiation is to include at least one anti-reflection layer disposed adjacent to each electroconductive layer (e.g., metal layer). In some cases, anti-reflection layers are placed on either side of an electroconductive layer to enhance light transmission through coated substrate having the shielding stack. An anti-reflection layer typically has a refractive index that differs from the adjacent electroconductive layer. Typically, anti-reflection layers are a dielectric or metal oxide material. Examples of anti-reflection layers include indium tin oxide (ITO), $In_2O_3$, $TiO_2$, $Nb_2O_5$, $Ta_2O_5$, $SnO_2$, ZnO or $Bi_2O_3$. In certain embodiments, an anti-reflection layer is a tin oxide layer having a thickness in the range of between about 15 to 80 nm, or between about 30 to 50 nm. In general, the thickness of the anti-reflection layer is dependent on the thickness of the conductive layer.

According to one aspect, a shielding stack includes at least one electroconductive layer (e.g. metal layer) and at least one anti-reflection layer adjacent each electroconductive layer. The anti-reflection layer may be, for example, a layer of material of "opposing susceptibility" such as a "color tuning" layer, a TCO layer, a DMIL layer, or other anti-reflection layer. With reference to FIG. 4, for example, the first composite conductor 410 of the electrochromic device 400 comprises a stack of a metal layer (e.g., silver) 412 disposed between one or more color tuning layers 411 and a first DMIL (e.g., $TiO_2$) 424, which can function as a shielding stack comprised of a metal layer sandwiched between anti-reflection layers. As another example, the first composite conductor 510 of the electrochromic device 500 in FIG. 5 comprises a stack of a metal layer 514 between the first TCO layer 512 and the second TCO layer 516 and DMIL 504, which can function as a shielding stack comprised of a metal layer sandwiched between anti-reflection layers. The second conductor 530 of the electrochromic device 500 in FIG. 5 has a stack of a metal layer 534 between the third TCO layer 532 and the fourth TCO layer 536, which can also function as a shielding stack comprised of a metal layer sandwiched between anti-reflection layers. Other examples can be found in other illustrated examples and elsewhere in the disclosure.

According to another aspect, a shielding stack includes two or more separate electroconductive layers (e.g. metal layers), along with an interlayer or anti-reflection layer between the electroconductive layers. An illustrated example of an electrochromic device that includes a shielding stack according to this construction is shown in FIG. 4. As shown, the electrochromic device 400 includes a first metal layer 412, a second metal layer 433, and if DMILs 424, 432 are made of $TiO_2$, they function as anti-reflections layers between the metal layers. Additional examples can be found in other illustrated embodiments and elsewhere in the disclosure. An interlayer may be made from materials that are transparent to short wave electromagnetic radiation in the visible spectrum while absorbing frequencies having longer wavelengths that are used for communication. An interlayer may be a single layer or a composite of several material layers. If an electrochromic window is of a laminate construction, a resin such as polyvinylbutyral ("PVB") or polyurethane may be used as an interlayer to laminate two transparent substrates together. In one example when a resin such as PVB is used, the thickness of the interlayer is in the range of about 0.25 mm to 1.5 mm.

According to another aspect, a shielding stack may comprise two or more electroconductive layers, where each electroconductive layer is sandwiched by an anti-refection layer. An illustrated example of an electrochromic device that includes a shielding stack according to this construction is shown in FIG. 5B. As shown, the electrochromic device 550 includes a first metal layer 564, a second metal layer 584, and TCOs that sandwich each of the metal layers. Additional examples can be found in other illustrated embodiments and elsewhere in the disclosure. In another aspect, four or more electroconductive layers may be used in a single shielding stack.

When a shielding stack having a single electroconductive layer is used in combination with a semiconductor metal oxide layer, or when a shielding stack having two electroconductive layers is used, the spacing between the electroconductive layers required to achieve a particular attenuation effect may depend on the composition (e.g., glass, air, gas, or EC device layers) and thickness of the layers that lie between the two electroconductive layers.

In one embodiment, a shielding stack includes a single layer of silver (or other conductive material) with a thickness in the range of about 15 nm to 60 nm. A thickness greater than about 15 nm of silver provides a low sheet resistance of less than 5 ohms per square. In one example, a single electroconductive silver layer will be between about 20 and 30 nm thick and thus allow sufficient absorption of electromagnetic radiation in communications frequencies while maintaining a sufficiently high light transmissivity. In this case, the silver layer may be electrically coupled to ground either by physical connection (e.g., a bus bar), or by capacitive coupling between the electroconductive layer and a metal frame that at least partially overlaps the electroconductive layer.

In one aspect, a shielding stack includes two layers of silver or other electroconductive material, each having a thickness in a range of about 7 nm to about 30 nm. A shielding stack with two layers of electroconductive material has been found to have a reduced light reflection for a given attenuation as compared to when a single, but thicker, silver layer is used. In one case, one of the electroconductive layers (first) is electrically coupled to ground either by physical connection (e.g., a bus bar), or by capacitive coupling between the electroconductive layer and a grounded metal frame that at least partially overlaps the electroconductive layer. The other (second) electroconductive layer may be capacitively coupled to the first grounded electroconductive layer, thus connecting the second electroconductive layer to ground. In another case, both the first and second electroconductive layers are physically connected to ground. In another case, one or both of the electroconductive layers have floating potentials (i.e., they are not electrically connected to ground or a source of defined potential). In the embodiments according to this aspect, most attenuation can be attributed to the reflection of electromagnetic radiation at the first electroconductive layer. Further attenuation occurs as a result of absorption in the interlayer region between the electroconductive layers (or their proximate antireflective layers) as the path length of incoming waves is greatly increased due reflections between the electroconductive layers, resulting in significant absorption of radiation reflecting within the interlayer.

In yet another embodiment, the outer surface of an electromagnetic-shielding, electrochromic window is coated with a transparent abrasion-resistant coating including an electroconductive semiconductor metal oxide layer, which may serve the purpose of a shielding stack or a portion thereof. In this embodiment, the lite also includes a shielding stack having a single layer of silver (or other conductive material) with a thickness of, e.g., between about 15 and 50 nm placed on one of the interior surfaces of the glass (e.g., S3 or S4), such as a surface not having an electrochromic stack. Optionally, an interlayer may be placed at any location between the metal oxide layer and the shielding stack to increase absorption of waves reflecting between the two electroconductive layers. In some instances the metal oxide layer and the shielding stack are placed on opposite lites of an IGU such that there is a gap between the metal oxide layer and the shielding stack. As examples, abrasion resistant coatings may be made from metal oxides such as tin doped indium oxide, doped tin oxide, antimony oxide, and the like. In this embodiment, the electroconductive layer and the abrasion resistant coating are electrically coupled to ground, either by physical connection (e.g., a bus bar), or by, e.g., capacitive coupling between the electroconductive layer and a metal frame that at least partially overlaps the layer.

In yet another embodiment, a shielding stack is incorporated into a flexible shielding film, which may be adhered to or otherwise mounted to a substrate. For example, an IGU may be configured for electromagnetic shielding by attaching a flexible shielding film to surface S1 or S4 of an IGU lite after the IGU is fabricated. Alternatively, during assembly of an IGU, the flexible shielding film may be attached to surface S2 or S3 of an IGU lite. As another example, a flexible shielding film may be embedded in the laminate during fabrication. In yet another example, an IGU can be constructed so that S2 has an electrochromic device, and the mate lite for the IGU is a laminate having a shielding film laminated between two substrates.

Flexible shielding films may be configured to block one or more of radio frequency (RF), infrared (IR) and ultraviolet (UV) signals. Some examples of flexible films such as SD2500/SD2510, SD 1000/SD 1010 and DAS Shield™ films, sold by Signals Defense, of Owings Mills, Md. are commercially available.

Figure 9:
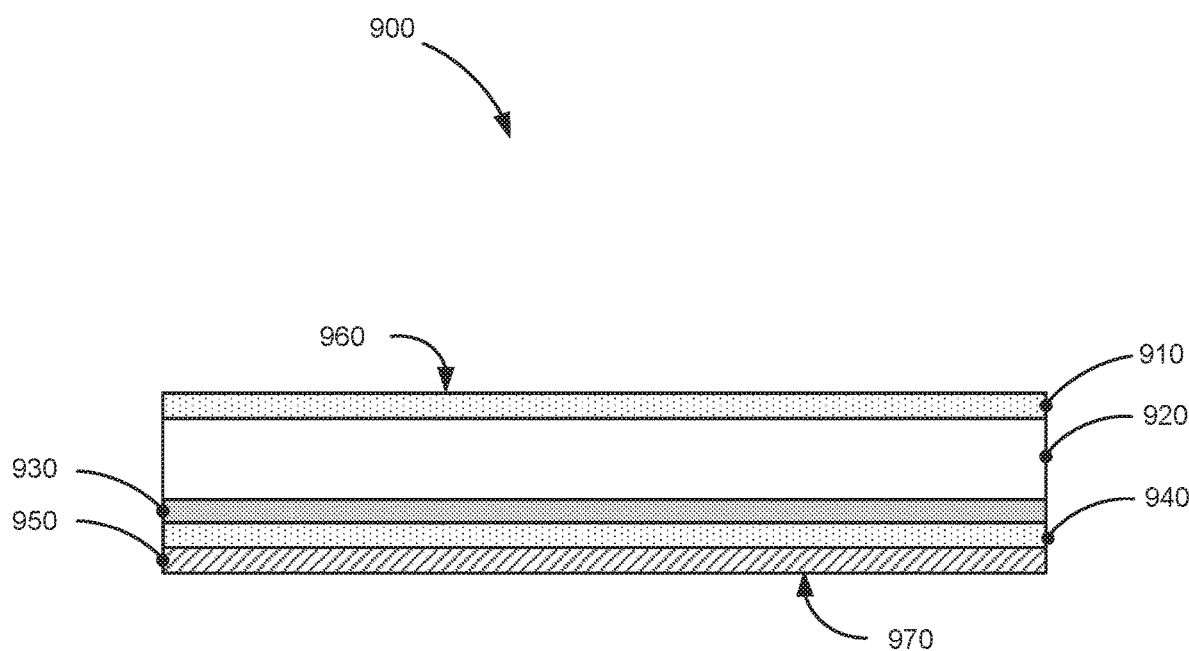
FIG. 9 depicts a schematic illustration of a flexible electromagnetic shielding film, according to embodiments.

FIG. 9 depicts a flexible electromagnetic shielding film 900 that may be mounted onto the surface of a substrate (without or without an electrochromic device) to provide electromagnetic shielding. A first film layer 910 is used as a substrate onto which a shielding stack 920 is deposited or formed. A laminate adhesive layer 930 is used to bond the shielding stack 920 to a second film layer 940, encapsulating the shielding stack 920 within a flexible film. A mounting adhesive layer 950 may also be included in the flexible electromagnetic shielding film 900 as shown in FIG. 9. The mounting adhesive layer 950 can then be used to bond the other layers of the shielding film 900 to the surface of the substrate of the window to provide electromagnetic shielding. In some cases, the total thickness of the flexible electromagnetic shielding film, when mounted on a lite, is between about 25 µm and 1000 µm. Optionally, an additional protective layer (not shown) may be located on the surface 960. The type of material that can be used for a protective layer varies depending on the window environment. Some examples of materials that can be used include materials such as epoxy, resin, or any natural or synthetic material that provides adequate protection to the shielding film structure. While a flexible electromagnetic shielding film is being transported, stored, or otherwise held prior to installation on a lite, optionally a release film layer may be located on the surface 970. The release film layer may protect the mounting adhesive layer 950 until the time of installation when the release film is removed.

In another embodiment, a flexible electromagnetic shielding film includes a substrate onto which a shielding stack is deposited or formed, and a mounting adhesive layer that bonds the shielding stack directly to the surface of the window substrate. This embodiment removes the laminate layer 930 and the second film layer 940 shown in FIG. 9.

Many materials may be suitable for film layers 910 and 940, for laminate adhesive layer 930, and for mounting adhesive layer 950. Typically materials chosen should be transparent to visible light and have sufficiently low haze so the optical properties of a lite are not substantially diminished. In certain embodiments, film layers are less than about 300 µm thick (e.g., between about 10 µm and 275 µm thick) and are made from a thermoplastic polymer resin. Examples of film materials include polyethylene terephthalate, polycarbonate, polyethylene naphthalate. One of skill in the art may select from a variety of acceptable adhesive layers and mounting adhesive layers. Depending on the thickness of a shielding stack, the placement of the film within an IGU unit, or the optical properties desired from a window configured for electromagnetic shielding, different adhesives may be used. In one example, the mounting adhesive layer 950 may be made from a pressure sensitive adhesive such as National Starch 80-1057 available from Ingredion Inc. Examples of other suitable adhesives include Adcote 76R36 with catalyst 9H1H, available from Rohm & Haas and Adcote 89r3 available from Rohm & Haas.

Layers described for electromagnetic shielding and/or the electrochromic device may be fabricated using a variety of deposition processes including those used for fabricating electrochromic devices. In some instances, the steps used for depositing a shielding stack may be integrated into the fabrication process steps for depositing an electrochromic device. In general, a shielding stack or an abrasion-resistant coating that is a semiconductor metal oxide may be deposited by physical and/or chemical vapor techniques onto a transparent substrate at any step in the fabrication process. Individual layers of a shielding stack are often well suited for being deposited by a physical vapor deposition technique such sputtering. In some cases, a silver (or other metal) layer is deposited by a technique such as cold spraying or even a liquid based process such as coating with a metal ink. In cases where a resin material such as PVB is used, the interlayer may be formed through a lamination process in which two substrates (optionally having one or more layers thereon) are joined together.

In some aspects, the shielding stack is disposed on one substrate and the electrochromic device is disposed on another substrate of an IGU, a laminate construction, or combination thereof. In one example, a laminate lite of an IGU includes the shielding stack, while a non-laminate lite of the IGU includes an electrochromic device. In another embodiment, both lites of the IGU are laminates, where one laminate lite includes a shielding stack and the other laminate lite includes an electrochromic device. In yet other embodiments, a single laminate includes both an electrochromic device coating and a shielding stack. The laminate may itself be a lite of an IGU or not.

Although the foregoing embodiments have been described in some detail to facilitate understanding, the described embodiments are to be considered illustrative and not limiting. It will be apparent to one of ordinary skill in the art that certain changes and modifications can be practiced within the scope of the above description and the appended claims.

What is claimed is:

1. An electromagnetic-shielding, electrochromic window comprising:
   a first multi-layer conductor disposed on a transparent substrate;
   an electrochromic stack disposed on the first multi-layer conductor; and
   a second multi-layer conductor, wherein one or both of the first and second multi-layer conductors comprises an electromagnetic shielding stack configured to block electromagnetic communication signals through the window, wherein the electromagnetic shielding stack comprises a first electroconductive material layer, an interlayer, and a second electroconductive material layer sandwiched between a first anti-reflection layer and a second anti-reflection layer, wherein the first and second electroconductive material layers are metal layers comprising silver and having a thickness in a range of about 7 nm to about 30 nm.

2. The electromagnetic-shielding, electrochromic window of claim 1, wherein the first anti-reflection layer comprises one or more of a transparent conductive oxide layer, a defect mitigating insulating layer, and a material layer of opposing susceptibility.

3. The electromagnetic-shielding, electrochromic window of claim 1, wherein the second anti-reflection layer comprises one or more of a transparent conductive oxide layer, a defect mitigating insulating layer DMIL, and a material layer of opposing susceptibility.

4. The electromagnetic-shielding, electrochromic window of claim 1, further comprising a window controller in communication with the electromagnetic shielding stack, the window controller configured to control activation and deactivation of blocking electromagnetic communication signals.

5. The electromagnetic-shielding, electrochromic window of claim 4, wherein the window controller is configured to activate electromagnetic communication signals by grounding one or more of the metal layers of the electromagnetic shielding stack.

6. The electromagnetic-shielding, electrochromic window of claim 4, wherein the window controller is configured to control tint of one or more electrochromic devices comprising the electrochromic stack.

7. The electromagnetic-shielding, electrochromic window of claim 1, wherein the electromagnetic shielding stack receives signals from a window controller configured to control activation and deactivation of blocking the electromagnetic communication signals.

8. The electromagnetic-shielding, electrochromic window of claim 7, wherein the window controller is configured to ground one or more of the metal layers of the electromagnetic shielding stack to activate blocking electromagnetic communication signals.

9. The electromagnetic-shielding, electrochromic window of claim 1, wherein the second electroconductive material layer is sandwiched between a third anti-reflection layer and a fourth anti-reflection layer.

10. The electromagnetic-shielding, electrochromic window of claim 1, wherein one or both of the first and second electroconductive layers have floating potentials.

11. The electromagnetic-shielding, electrochromic window of claim 1, the electromagnetic shielding stack configured for passive blocking of electromagnetic communication signals.

12. The electromagnetic-shielding, electrochromic window of claim 1, wherein the electromagnetic shielding stack is configured as a high pass filter, a low pass filter, or a bandpass filter.

13. The electromagnetic-shielding, electrochromic window of claim 1, wherein the electromagnetic shielding stack is configured to block Wi-Fi communication signals.

14. The electromagnetic-shielding, electrochromic window of claim 1, wherein the electromagnetic shielding stack is configured to transmit communication signals with wavelengths about 800 Mhz.

15. The electromagnetic-shielding, electrochromic window of claim 1, wherein the first anti-reflection layer and/or the second anti-reflection layer comprise indium tin oxide, $In_2O_3$, $TiO_2$, $Nb_2O_5$, $Ta_2O_5$, $SnO_2$, ZnO or $Bi_2O_3$.

16. The electromagnetic-shielding, electrochromic window of claim 1, wherein the first anti-reflection layer and/or the second anti-reflection layer comprise an indium tin oxide layer having a thickness of between about 15 nm and 80 nm.

* * * * *